(12) United States Patent
Tardieux et al.

(10) Patent No.: US 7,114,093 B2
(45) Date of Patent: Sep. 26, 2006

(54) GENERIC ARCHITECTURE AND SYSTEM FOR A PROGRAMMABLE SERIAL PORT HAVING A SHIFT REGISTER AND STATE MACHINE THEREIN

(75) Inventors: Jean-Louis Tardieux, Lexington, MA (US); Joern Soerensen, Aars (DK)

(73) Assignee: Analog Devices, Inc., Norwood, MA (US)

( * ) Notice: Subject to any disclaimer, the term of this patent is extended or adjusted under 35 U.S.C. 154(b) by 617 days.

(21) Appl. No.: 10/231,526

(22) Filed: Aug. 29, 2002

(65) Prior Publication Data

US 2003/0117176 A1 Jun. 26, 2003

Related U.S. Application Data

(60) Provisional application No. 60/315,655, filed on Aug. 29, 2001.

(51) Int. Cl.
*G06F 13/00* (2006.01)
*H03M 7/00* (2006.01)

(52) U.S. Cl. .................... 713/600; 710/100; 341/50
(58) Field of Classification Search .................. None
See application file for complete search history.

(56) References Cited

U.S. PATENT DOCUMENTS 3,680,050 A 7/1972 Griffin
5,557,751 A * 9/1996 Banman et al. ............. 398/136
6,748,475 B1 * 6/2004 Sørensen .................... 710/305
6,865,503 B1 * 3/2005 Harper et al. ............... 702/122

FOREIGN PATENT DOCUMENTS

| EP | 0 666 529 A1 | 1/1995 |
|---|---|---|
| JP | 56078254 | 6/1981 |
| JP | 61287335 | 12/1986 |
| WO | WO 01/35234 A1 | 5/2001 |
| WO | WO 02/42919 A2 | 5/2002 |

OTHER PUBLICATIONS

AD6522, "Digital Baseband Processor Specification", Version 1.7b, Dec. 22, 2000 ADI Publication, pp. 98-120.

* cited by examiner

*Primary Examiner*—Lynne H. Browne
*Assistant Examiner*—Anand B. Patel
(74) *Attorney, Agent, or Firm*—Wolf, Greenfield. & Sacks, P.C.

(57) ABSTRACT

A high-speed programmable serial port having a finite state machine, a clock generator capable of controlling shifting of bits from a shift register and a shift register having a bit counter capable of maintaining a numbered count of data bits in a serial output. The clock generator and shift register reduce the burdens on a finite state machine, thus improving data throughput and the ability to provided data according to a multitude of data protocols.

65 Claims, 15 Drawing Sheets

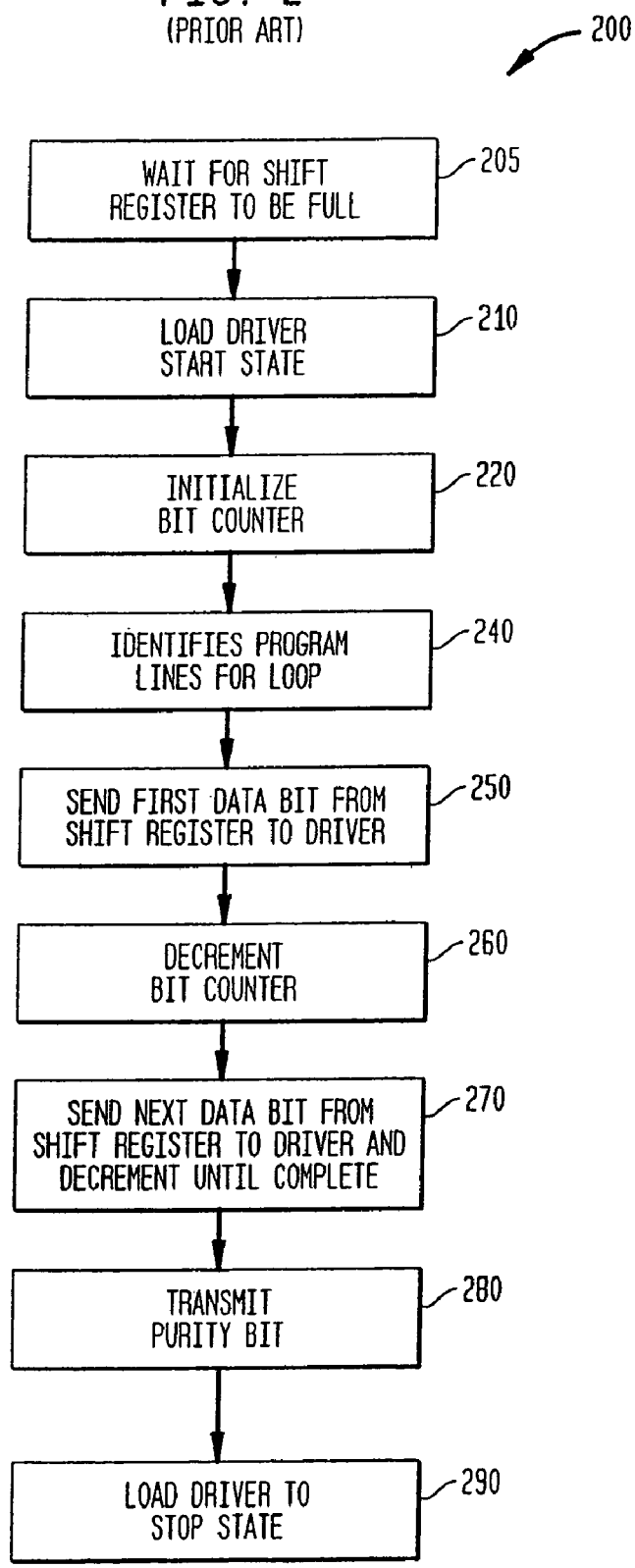

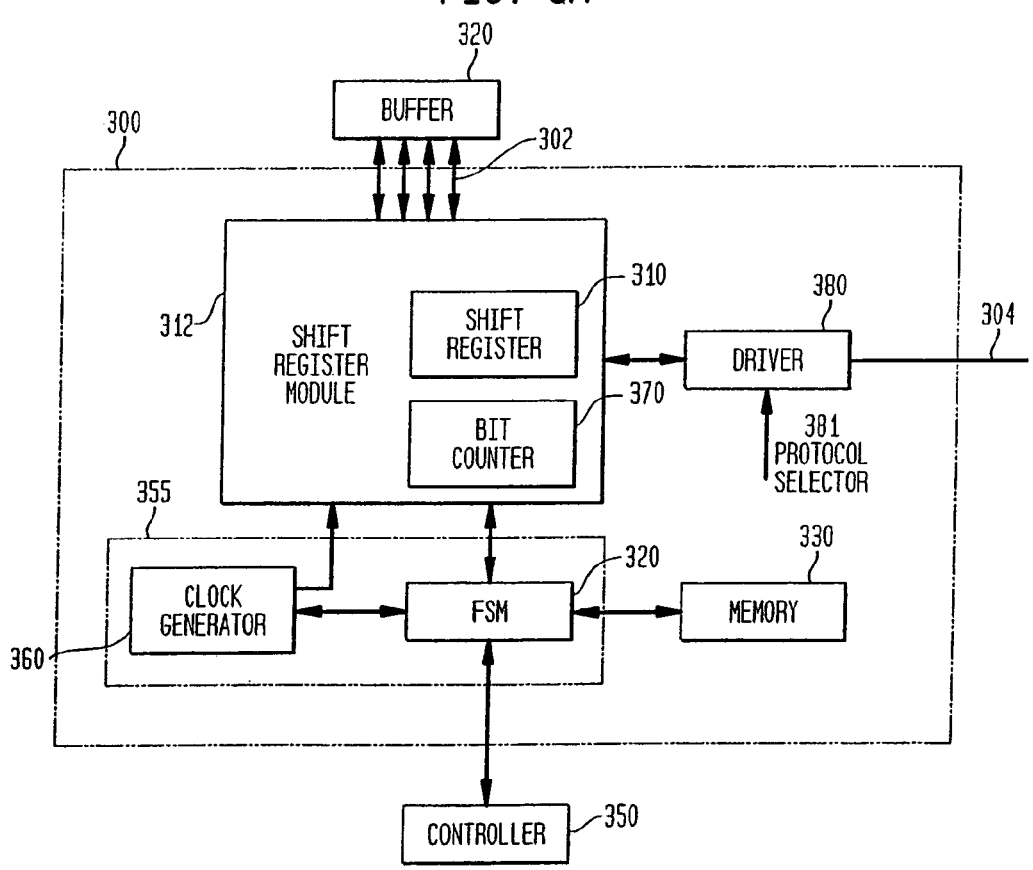

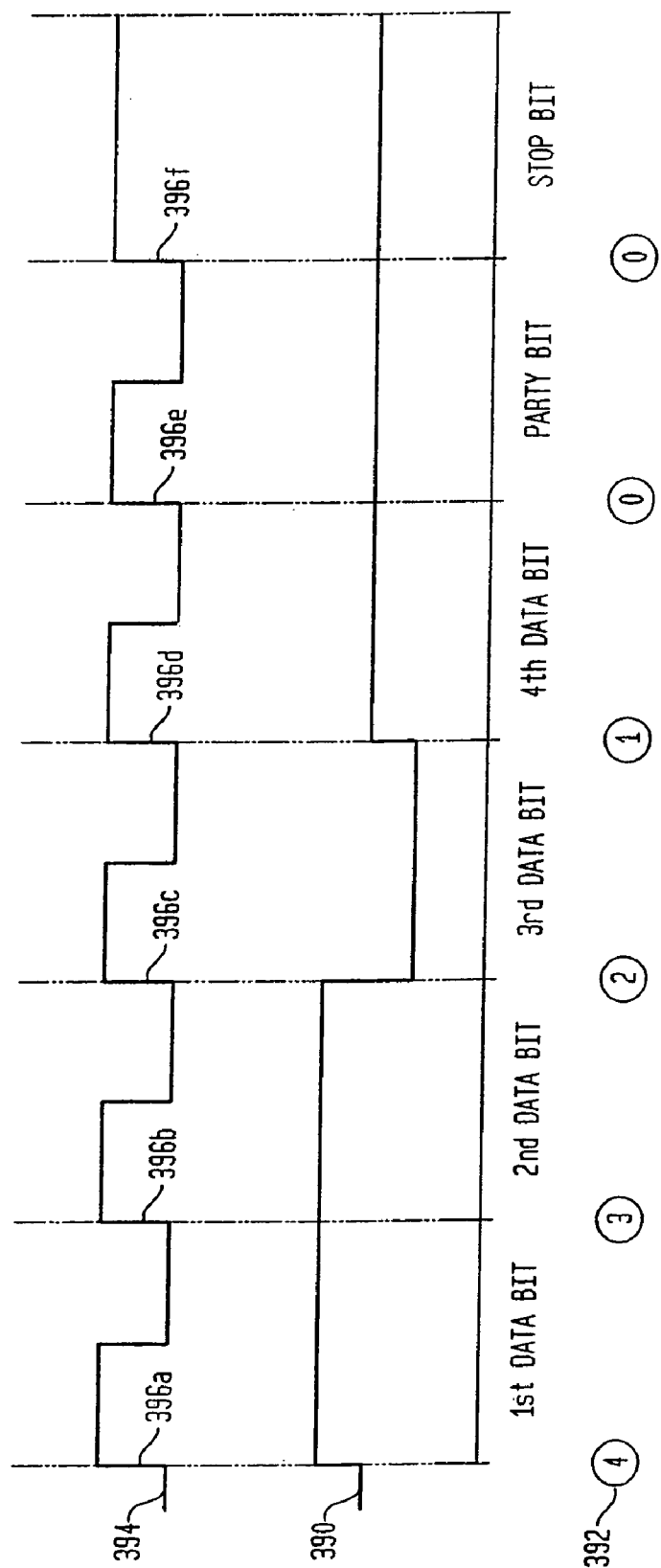

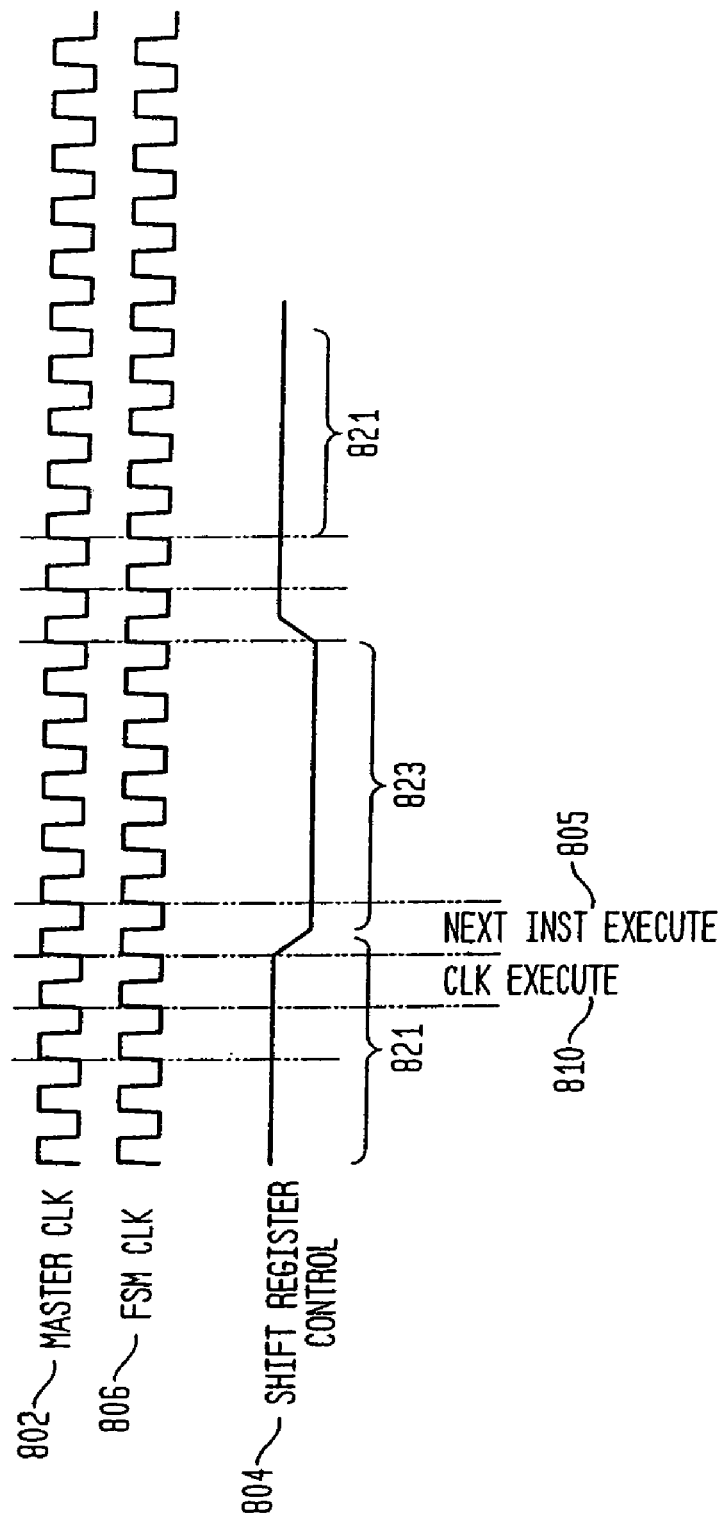

FIG. 10A

BIT LOCATIONS

| INSTRUCTION | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| LOAD | d | d | d | d | d | d | d | d | 1 | 0 | 1 | 0 | 1 | 1 | 1 | 0 |
| DUAL BIT LOAD | d | d | d | d | d | d | d | d | 1 | 1 | 1 | 1 | 1 | 1 | 1 | 1 |
| MASK | m | m | m | m | m | m | m | m | 0 | 0 | 0 | 1 | v | 1 | 1 | 1 |
| TRIGGER | | | | | | | | | 1 | 1 | 0 | 1 | s | 1 | 1 | 1 |
| JUMP ABSOLUTE | a | a | a | a | a | a | a | a | 0 | 1 | 1 | 0 | v | bi | bi | bi |
| JUMP SHORT RELATIVE | | | | | | | | | 1 | · | 1 | 0 | 1 | 0 | a | a |
| CALL ABSOLUTE | a | a | a | a | a | a | a | a | 1 | 1 | 1 | 0 | 0 | 0 | 0 | 0 |
| RETURN | | | | | | | | | 1 | 1 | 1 | 1 | 1 | 1 | 0 | a |
| SOFTWARE RESET | | | | | | | | | 1 | 1 | 1 | 1 | 1 | 1 | 1 | 1 |
| LOOP | o1 | o1 | o1 | o1 | o1 | o1 | o2 | o2 | 1 | 1 | 0 | 1 | 1 | 0 | 0 | o1 |
| DELAY | | | | | | | | | 0 | 0 | 0 | d | 1 | 1 | d | d |
| LONG DELAY | | | | | | | | | 1 | 1 | 1 | d | 1 | 1 | 0 | o1 |
| WAIT | c2 | c2 | c2 | c2 | c2 | c2 | c2 | c1 | 1 | 1 | 0 | 0 | 0 | 0 | 0 | o1 |
| CLOCK | de | d | d | d | d | d | d | d | 1 | 1 | 0 | 0 | 1 | m | v2 | v1 |
| COMPARE DATA | d | d | d | d | d | d | d | d | 1 | 1 | 1 | 1 | 0 | 0 | cd | cd |
| CONDITIONAL EXECUTION | | | | | | | | | 1 | 1 | 1 | 1 | cc | cc | il | il |
| COMPARE REGISTER | cc | | | | | | i | | 1 | 1 | 0 | 0 | 0 | 1 | | |
| EXTEND | | | | | | | | | 1 | 1 | 1 | 1 | 0 | 0 | 1 | 1 |

1004 (indicates row for LOAD, bits 7–4: 1,0,1,0)

1002 — INSTRUCTION
1004a — LOAD
1006 — DUAL BIT LOAD
1012a — MASK
1014 — TRIGGER
1016a — JUMP ABSOLUTE
1018 — JUMP SHORT RELATIVE
1020a — CALL ABSOLUTE
1022a — RETURN
1024 — SOFTWARE RESET
1028a — LOOP
1030a — DELAY
1032 — LONG DELAY
1034a — WAIT
1036 — CLOCK
1040 — COMPARE DATA
1038 — CONDITIONAL EXECUTION
1010 — COMPARE REGISTER / EXTEND

FIG. 10B

BIT LOCATIONS

| INSTRUCTION\FORMAT | 15 | 14 | 13 | 12 | 11 | 10 | 9 | 8 |
|---|---|---|---|---|---|---|---|---|
| 1016b JUMP SHORT RELATIVE | 0 | 0 | 0 | 0 | 0 | 0 | 0 | 0 |
| 1030b LONG DELAY | 0 | 1 | 0 | 1 | 0 | 0 | i | i |
| 1020b RETURN | 0 | 1 | 0 | 1 | 1 | 0 | 0 | 0 |
| 1022b SOFTWARE RESET | 0 | 1 | 0 | 1 | 1 | 0 | 0 | 1 |
| 1028b DELAY | 0 | 1 | 1 | d | d | d | d | d |
| 1012b TRIGGER | 1 | 0 | = | i | v | bi, | bi | bi |
| 1004b DUAL BIT LOAD | 1 | 1 | 0 | 1 | i | i | i | i |
| 1008 MAP | 1 | 1 | 1 | 0 | - | - | - | - |
| 1026 NULL | 1 | 1 | 1 | 1 | 1 | 1 | - | - |

GENERIC ARCHITECTURE AND SYSTEM FOR A PROGRAMMABLE SERIAL PORT HAVING A SHIFT REGISTER AND STATE MACHINE THEREIN

RELATED APPLICATIONS

This application claims the benefit of U.S. Provisional Application No. 60/315,655 under 35 U.S.C. §119(e), filed Aug. 29, 2001, entitled "DIGITAL BASEBAND PROCESSOR," by Allen, et al. The entirety of the above provisional application is hereby incorporated by reference.

FIELD OF THE INVENTION

The present invention relates generally to programmable serial ports and more particularly, to high-speed programmable serial ports.

BACKGROUND OF THE INVENTION

Many serial port arrangements are known in the field of electronic circuits and data communications. For example, arrangements include static serial ports for transmitting and receiving data of a selected serial communications protocol (e.g., Universal Asynchronous Receiver Transmitter (UART) devices), and configurable serial ports (e.g., microprocessors with software controlled serial ports). Configurable serial ports provide the possibility of servicing a multiplicity of protocols with a single serial port device. Static and configurable serial ports are used for a wide range of applications, including communication with display devices, communication with modems, and serving as a universal system connector (USC).

Numerous serial communications protocols (also referred to herein as protocols) have been promulgated (e.g., to name a few, UART, I²C, HC11, IrDa), each defining specific parameters under which serial bits of data are communicated between serial ports. The parameters defining a protocol may include factors such as the timing of bits received or transmitted, electrical parameters (e.g., signal polarity, line driver characteristics, such as open-source or open collector output impedances, etc.), and logical definitions of bit meanings and sequences and sequences.

One example of a configurable serial port is provided by the Motorola M68HC11 family of microcontrollers, which include a programmable serial port known in the art as the Motorola Synchronous Serial Peripheral Interface (SPI). Such serial interfaces may be disadvantageous for several reasons. For example, the processor must execute a software program to control the serial port, and all data bits to be sent over signal paths pass through the processor, thus loading the processor, beyond whatever load is imposed on the processor as the processor performs the tasks for which it is otherwise employed. Also, because the serial hardware is a power-consuming part of the processor, additional power is consumed whenever the processor is executing a software program even if the serial port is inactive.

As an alternative to microcontroller-controlled programmable serial ports, programmable serial ports implementing a finite state machine have been developed to off-load from the processor the burden of having to control many aspects of the serial port. An example of such a programmable serial port is given in U. S. patent application entitled GENERIC SERIAL PORT ARCHITECTURE AND SYSTEM, Ser. No. 09/706,450, by Sorenson, filed Nov. 3, 2000.

FIG. 1 is a block diagram of such a programmable serial port 100. In FIG. 1, when operating in transmit mode, a shift register 110 receives a parallel set of data bits on channels 102 from a buffer 120 and outputs the bits as a serial output on channel 104 (via a driver 180) under the control of a finite state machine (FSM) 120. Conversely, when operating in a receive mode, shift register 110 receives a serial input on channel 104 and outputs a parallel set of data bits on channels 102.

The phrase "finite state machine" is defined herein to be any device that stores an existing status (e.g., a program counter and a plurality of other registers) and upon receiving an input (e.g., an instruction or command), changes to a new status and/or causes a deterministic action or output to take place in response to the existing status and the input. While FSMs may not include an arithmetic logic unit (ALU) or other circuits conventionally associated with microprocessors, the term FSM as defined herein does not exclude devices including such circuitry or elements.

In programmable serial port 100, instructions corresponding to rules for implementing two or more protocols are stored in a memory 130. Using the instructions from memory 130, FSM 120 executes instructions corresponding to a protocol selected by controller 150 to provide an output according to the specified protocol on channel 104. A bit counter 170 provides the FSM 120 with a numbered count of bits transferred, to facilitate providing an output according to the selected protocol, as the processing of a bit frequently depends on the position in either the parallel channels 102 or the received or transmitted serial bit stream on channel 102. Typically an output is directed through a driver 180 to provide an output having (or compatible with) specific electrical parameters. In conventional FSM-based programmable serial ports (e.g., programmable serial port 100), execution of instructions to provide an output according to a selected protocol requires that FSM 120 receive a clock pulse from clock generator 160 and provide a clock signal to shift register 110 to control output of each bit from shift register 110 to channel 104 or buffer 120, as the case may be, and requires that the FSM maintain and process a bit count provided by a bit counter 170.

Providing an output according to a selected protocol requires that an output be provided at specified times. For example, in some protocols, an output on channel 104 must occur within aspecified time period following receipt of a timing signal (e.g., a rising edge on a channel 190) by programmable serial port 100. Because the time interval between receiving the clock signal and providing the output may be very short, an instruction set to achieve an output must be capable of short execution times or the serial port may have inadequate data output speed, and in some instances may be prohibited from serving some output protocols.

FIG. 2 is a flow chart 200 of a typical set of instructions for a conventional programmable serial port to achieve a standard output (e.g., a UART-compatible output). At step 205, the FSM waits for an indication that the shift register is full of data (i.e., a parallel set of data). At step 210, the FSM loads the driver with a start state (e.g., logic value one or zero). At step 220, the FSM initializes the bit counter (e.g. an initial bit count is loaded). At step 240, the FSM identifies the lines of code that define the loop by which data is shifted from the shift register. The first data bit is sent and maintained for as many clock cycles as necessary for the protocol, and the bit counter is decremented by the FSM at steps 250 and 260, respectively. Subsequent data bits are sent and the bit counter is decremented by the FSM (step 270), until the bit counter reaches zero. After all data bits are sent, the FSM causes a parity bit to be sent at step 280. Finally, the driver is set to a stop state at step 290.

One method of achieving faster execution time is to increase the clock rate at which the FSM executes instructions such that a greater number of instructions are executed in a given time interval (e.g., the time interval between a timing signal and commencement of outputting of serial data bits); however, a faster clock rate may require faster and more expensive electronic components. Additionally, a faster clock rate may require an increased power expenditure. Accordingly, a programmable serial port is needed which is able to receive and process any necessary inputs (e.g., timing signals) and provide any necessary outputs at a relatively high speed, while maintaining a relatively low clock speed. Additionally, a programmable serial port is needed which is capable of providing outputs and accepting inputs according to a wide variety of protocols.

SUMMARY OF THE INVENTION

Aspects of the present inventions are directed to programmable serial ports having an FSM, a clock generator controllable by the FSM to produce programmed clock signals pursuant to an FSM instruction, a shift register module capable of producing an output of data bits pursuant to the programmed clock signals and any FSM bit operations, and maintaining a numbered count of output data bits; accordingly, the number of instructions executed by the FSM to achieve an output according to a selected protocol is relatively fewer and the overall execution time to achieve an output is relatively short, since the clock generator may be controlled at a relatively high level by the FSM.

A first aspect of the invention is a clock generator for use in a programmable serial port having a first shift register module and a finite state machine, comprising a first output channel to a first shift register module, the first output channel providing to the first shift register a first clock signal comprising a predetermined number of pulses, at a predetermined rate in response to at least one instruction determining said number of pulses and said rate, and an input channel to receive at least one instruction, the at least one instruction indicative of the predetermined number of pulses, and the predetermined rate.

The clock generator may further comprise a second output channel to a second shift register module, the second output channel providing a second clock signal comprising a predetermined number of pulses, at a predetermined rate in response to at least one instruction. Optionally, the clock generator may further comprise a second output channel to a finite state machine, the second output channel providing a second clock signal to the finite state machine. In some embodiments, the clock generator further comprises a gate coupled to the second output channel, such that the second clock signal passes through the gate, the gate controllable by the at least one of the instructions indicative of the predetermined number of pulse, and the predetermined rate. In other embodiments of the first aspect of the invention, the clock generator further comprises a divider coupled to the second output channel to receive the second clock signal, and coupled to the first output channel to provide the first clock signal, whereby the second clock signal is divided to form the first clock signal.

A second aspect of the invention is a shift register control module, to control a first shift register module including a first shift register having an input channel to receive a parallel input of a first plurality of bits and a serial output channel to provide a serial output of a second plurality of bits, and further having at least one register for controlling the shift register responsive to instructions, comprising a first finite state machine to provide said instructions, and a clock generator coupled to the first finite state machine, providing a first clock signal comprising a first plurality of clock pulses to the first shift register in response to at least one instruction from the first finite state machine, the serial output of the second plurality of bits occurring in response to at least one of said instructions provided to the first shift register module and the first clock signal.

The first finite state machine may be clocked by a second signal provided by the clock generator. In some embodiments, the clock generator is coupled to the first finite state machine through a gate controllable by an at least one of the instructions. Optionally, the shift register control module, may further comprise a divider coupled to the first finite state machine to receive the second clock signal, and coupled to the first shift register module to provide the first clock signal, wherein the second clock signal is divided to form the first clock signal. In some embodiments of the second aspect of the invention, the shift register control module the at least one program instruction is from the finite state machine, and in some embodiments the finite state machine is configured and arranged to provide instructions corresponding to a plurality of serial communications protocols.

A third aspect of the invention is a programmable serial port, comprising a first shift register module including a shift register having an input channel to receive a parallel input of a first plurality of bits and a first output channel to provide a serial output of a second plurality of bits, and further having a register for controlling the shift register module responsive to instructions, a first finite state machine to provide said instructions, the finite state machine providing said instructions to the shift register module to control operation of the shift register, and a clock generator coupled to the finite state machine, providing a first clock signal comprising a first plurality of clock pulses to the first shift register module in response to at least one of said instructions from the finite state machine, the serial output of the second plurality of bits occurring in response to said instructions provided to the shift register module and the first clock signal.

Optionally, the clock generator comprises a second output channel to the first finite state machine, the channel providing a second clock signal to the first finite state machine, the signal comprising a second plurality of clock pulses. In some embodiments, the clock generator is coupled to the first finite state machine through a gate controllable by an at least one of the instructions. The gate may be controllable to block the second clock signal while shift register provides the serial output.

In some embodiments, the programmable serial port further comprises a divider coupled to the second output channel to receive the second clock signal, and coupled to the first output channel to provide the first clock signal, wherein the second clock signal is divided to form the first clock signal. The finite state machine may be configured and arranged to provide instructions corresponding to a plurality of serial communications protocols. Each of the second plurality of bits may be output in response to a clock pulse of the second plurality of pulses.

In some embodiments, the shift register module further comprises a bit counter, the bit counter configured to maintain a numbered count of the serial output of the second plurality of bits. Optionally, the bit counter is decremented in response to a clock pulse of the second plurality of pulses.

Each of the second plurality of bits may be one of a data bit, a parity bit, and a stop bit. Optionally, each of the second plurality of bits is selected based on the bit count.

The shift register module may further comprise a parity generator. In some embodiments, the shift register module outputs a parity bit from the parity generator in response to a clock pulse of the second plurality of pulses. The programmable serial port may further comprise a programmable driver coupled to the first output channel to control the electrical parameters of the serial output. An interrupt processing module may be coupled to the first finite state machine to cause an interrupt of the finite state machine. The programmable serial port may further comprise a second shift register module, the clock generator coupled the second shift register module to provide a second clock signal comprising a second plurality of clock pulses, the second shift register module providing a second serial output in response to the second clock signal.

A fourth aspect of the invention is a programmable serial port, comprising a shift register module having an input channel to receive a parallel input of a plurality of bits and an output channel to provide a serial output of the plurality of bits, the shift register module including a shift register to provide the serial output and a bit counter, the bit counter configured to maintain a numbered count of the serial output of the plurality of bits, the serial output and the bit counter responsive to instructions and a finite state machine coupled to the shift register module to provide said instructions to the shift register module.

The bit counter may be decremented in response to a clock pulse. In some embodiments, the shift register module further comprises a parity generator. The shift register module may provide a parity bit in response to the numbered count. Each of the plurality of bits corresponding to the serial output may be one of a data bit, a parity bit, and a stop bit. Optionally, each of the plurality of bits corresponding to the serial output is selected based on the numbered count.

A fifth aspect of the invention is a method of controlling a shift register module comprising a first shift register containing a first plurality of bits, to provide a serial output according to a selected one of a plurality of serial communications protocols, the first shift register module coupled to a clock generator and a finite state machine, said method comprising according to the selected protocol, selecting an instruction sequence to be executed by the finite state machine from among a plurality of instruction sequences, each of the instruction sequences corresponding to a protocol, controlling the clock generator according to an instruction of the selected instruction sequence to provide a first plurality of clock pulses to the shift register module, without further control by the finite state machine; and outputting a second plurality of bits corresponding to first plurality of bits in response to the clock pulses and execution of the instruction sequence.

The method of controlling a shift register module may further comprise an act of maintaining a count of the second plurality of bits. The method of controlling a shift register module may further comprise an act of selectively outputting a parity bit in response to the count. Some embodiments of the method of controlling a shift register module further comprise the act of controlling the clock generator to provide a third plurality of clock pulses to a second shift register module containing a third plurality of bits, and outputting a fourth plurality of bits corresponding to third plurality of bits, in response to the clock pulses.

Optionally, the method of controlling a shift register, may further comprising an act of controlling the clock generator to provide a second plurality of clock pulses to control execution of the instruction sequence by the state machine. In some embodiments, the method of controlling a shift register, further comprises an act of blocking the second plurality of clock pulses, wherein the executing of the plurality of instruction is caused to cease, while outputting the second plurality of bits. The controlling of the clock generator according to an instruction may include specifying the number of pulses and the clock rate.

BRIEF DESCRIPTION OF THE DRAWINGS

Illustrative, non-limiting embodiments of the present invention will be described by way of example with reference to the accompanying drawings, in which the same reference number is used to designate the same components in different figures, and in which:

FIG. 2 is a flow chart of a typical set of instructions for a conventional programmable serial port to achieve a standard output (e.g., a UART-compatible output);

FIG. 3A is a functional block diagram of a first exemplary embodiment of a programmable serial port according to at least some aspects of the present invention;

FIG. 3B illustrates a timing diagram for an exemplary output bit stream from a shift register module configured to automatically output a parity bit and a stop bit;

FIG. 8A illustrates an exemplary clock generator output for a clock generator generating one clock pulse in a standard mode;

FIG. 10A is a schematic illustration of one suitable memory organization suitable for use with present invention;

FIG. 10B is a schematic illustration of an exemplary FSM decode architecture suitable for use with the memory organization of FIG. 10A.

DETAILED DESCRIPTION

Figure 1:
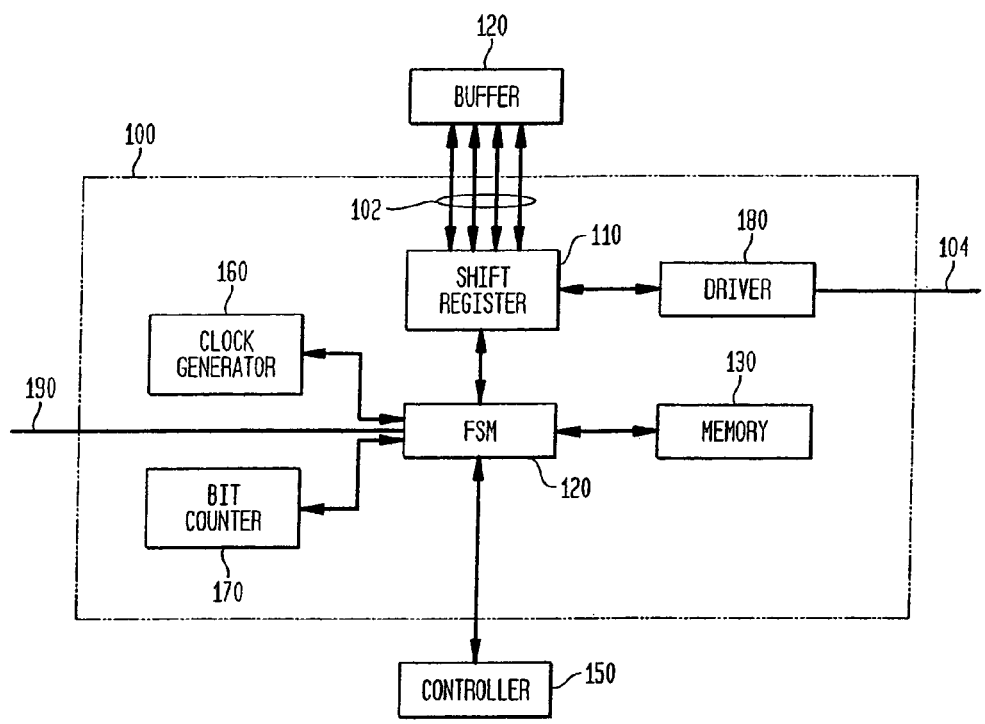
FIG. 1 is a block diagram of a conventional programmable serial port.

FIG. 3A is a functional block diagram of a first exemplary embodiment of a programmable serial port 300 according to at least some aspects of the present invention. Programmable serial port 300 transfers a parallel set of data bits comprised of a plurality of bits (e.g., a byte of data) on channels 302, and provides a serial output of a second plurality of bits corresponding to the first plurality of bits on a channel 304. Programmable serial port 300 also may be used to receive a serial input on channel 304 and provide a parallel output on channels 302. Furthermore, programmable serial port 300 may operate in simplex or half duplex modes. In the discussion which follows, emphasis will be placed primarily on the parallel input/serial output mode of operation, as the serial input/parallel output operation usually will be apparent therefrom without further elaboration.

Programmable serial port 300 includes of a finite state machine 320, a clock generator 360 (also referred to herein as a clock pulse generator), a shift register module 312, and a driver 380. A controller 350 (of a conventional nature) controls some functions of the programmable serial port 300, for example, by initializing any of the above components comprising programmable serial port 300, by selecting a protocol under which the serial communication is to occur, and filling buffer 320.

As described in greater detail below, FSM 320 controls operation of shift register 312 and clock generator 360 by providing commands to each of them, including controlling configuration registers of each. FSM 320 executes instructions corresponding to a protocol program selected by controller 350. For example, the controller provides a program code line number of a set of instructions corresponding to a selected protocol program stored in a memory 330. The memory may include a plurality of instructions each corresponding to a different protocol A shift register module 312 receives a parallel input of a plurality of bits from a buffer 320 on channels 302, and provides a serial output corresponding to the plurality of bits to driver 380. Shift register module 312 includes a shift register 310 to serialize data received on channel 302, and a bit counter 370. Bit counter 370 is configured to maintain a numbered count of the bits of serial data output by shift register module 312.

Clock generator 360 is coupled to finite state machine 320, and provides one or more clock pulses to shift register 310 in response to at least one instruction from finite state machine 320. The clock pulses control timing of the shifting of data into and out of shift register module 312. Clock generator 360 has an input channel to receive at least one instruction from the finite state machine 320, and an output channel to provide clock pulses to the finite state machine 320. For example, in response to at least one instruction, clock generator 360 may provide to shift register 310 a predetermined number of clock pulses, at a predetermined rate, at a predetermined time (or after a predetermined delay). In some embodiments, finite state machine 320 provides a single command to clock generator 360 to generate a predetermined number of pulses, at a predetermined rate, to reduce the amount of execution time necessary to control the clock generator. Therefore, the number of instructions executed by the FSM to achieve an output according to a selected protocol is relatively fewer and the overall execution time to achieve an output is relatively short; thus, the programmable serial port 300 is capable of providing outputs and accepting inputs according to a wide variety of protocols. FSM 320 and clock generator 360 together form a shift register control module 355 for controlling shift register module 312.

In response to a clock pulse received from clock generator 360 (which may be preceded by other clock pulses for other purposes), shift register module 312 outputs a single data bit to driver 380, and the bit counter 370 is decremented or incremented (depending on whether a protocol specifies that the most significant bit or the least significant bit is to be transmitted first). Shift register 312 may be configured such that, for selected protocols, the first clock pulse received after the counter reaches zero automatically results in an output of a parity bit, and the second clock pulse received after the counter reaches zero results in output of a stop bit.

FIG. 3B illustrates a timing diagram for an exemplary output bit stream 390 from a shift register module 312 configured to automatically output a parity bit and a stop bit. In addition to output bit stream 390, a corresponding bit count 392 of bit counter 370 (shown in FIG. 3A above), and clock signal 394 from clock generator 360 (shown in FIG 3A) are illustrated. In the exemplary bit stream 390, the data bits are assumed to be output on the rising edge of clock signal 394. Upon receiving each of the rising edges 396 a–d (corresponding to bit counts 1–4), respectively, a corresponding data bit is output. Upon receiving the first rising edge 396e when the bit count is 0, a parity bit is output; and upon receiving the second rising edge 396f when the bit count is 0 a stop bit is output.

Referring again to FIG. 3A, driver 380 is coupled to channel 304 to provide line driving and receiving circuitry and parameters required by the selected protocol. For example, driver 380 may allow for selection of desired line driver circuit type such as an open source or open collector line driver circuit, selection of the polarity of an output signal, and selection of a high impedance state. Additionally driver 380 may allow for selection of a data source (e.g., output at a fixed logic value (i.e., one or zero), an input/output from an FSM, or an input/output from a shift register). The driver may also detect data-in/data-out mismatches. Additionally, in half duplex mode, driver 380 may multiplex data sent and received on channel 304. Driver 380 preferably is programmable in response to a protocol selection signal shown as supplied on line 381 to effect protocol-related selections and operations. The protocol selection signal comes directly or indirectly from controller 350. While driver 380 is illustrated as having output channel 304, it is understood that driver 380 may provide one or more additional outputs, such as a clock signal(s). Driver 380 is further described, below, with reference to FIG. 6.

Figure 4A:
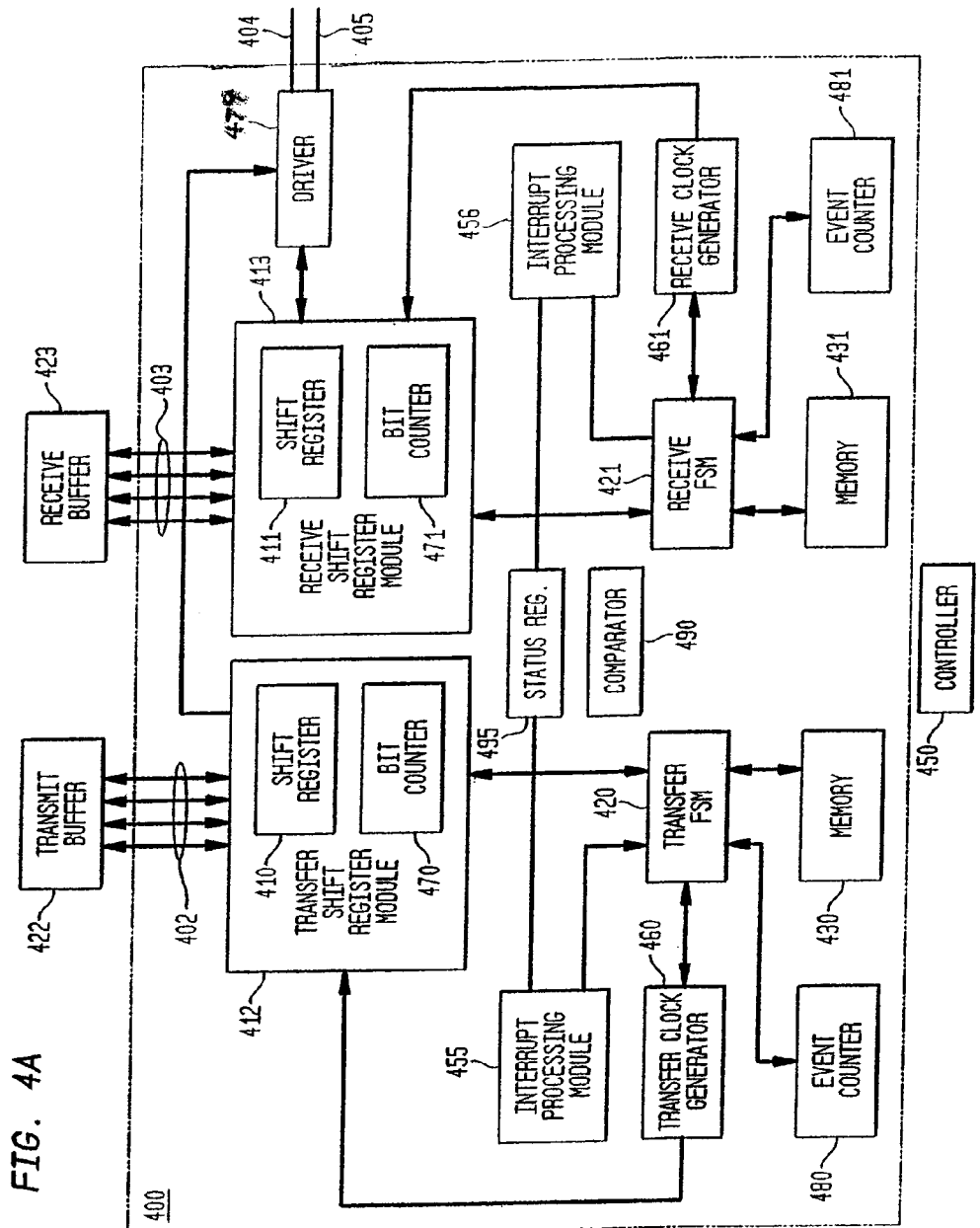
FIG. 4A is a functional block diagram of a second exemplary embodiment of a programmable serial port according to at least some aspects of the present invention.

FIG. 4A is a functional block diagram of a second exemplary embodiment of a programmable serial port 400 according to at least some aspects of the present invention. Programmable serial port 400 includes driver 479 two finite state machines 420 and 421, each having a corresponding memory 430 and 431, shift register module 412 and 413, and clock generator 460 and 461. Shift registers modules 412 and 413, and clock generator 460 and 461. Shift registers modules 412 and 413, have corresponding shift registers 410 and 411 and bit counter 470 and 471. Shift registers 410 and 411 receive parallel data bits from buggers 422 and 423 and provide a serial output on channels 404 and 405, respectively.

As above, a controller 450 controls some functions of the programmable serial port 400, for example, by initializing any of the above components comprising programmable serial port 400 and by selecting a protocol under which the inputs and outputs are processed.

Programmable serial port 400 is configured to allow simultaneous transmitting and receiving of data via shift register modules 412 and 413, respectively; accordingly, programmable serial port 400 is capable of full-duplex communication or half duplex communication. To achieve full duplex communication, shift registers modules 412 and 413 operate simultaneously to send and receive data, respectively; and to operate in half duplex mode, shift register modules 412 and 413 transmit/receive data on alternate time cycles.

In some embodiments, programmable serial port 400 includes two event counters 480 and 481 associated with FSMs 420 and 421, respectively. Event counters 480 and 481 are registers which increment or decrement in response to an input, such as a clock signal or a signal from FSMs 420 and 421. Each of event counters 480 and 481 is capable of providing a corresponding count register value. Counters 480 and 481 are configurable to increment or decrement in response to an input from an FSM or other source (e.g., a clock) For example, a count register value may be accessible via the Compare instruction (discussed below), additionally a count register may be hardwired to provide an output to an associated FSM upon the occurrence of an event (e.g., the counter 480, 481 is decremented to zero, or a register overflow has occurred.) In some embodiments, upon the execution of specified instructions (a Delay instruction, a Wait command or a Clock command invoking the power save mode (each such instruction being described below)) an FSM clock signal 705 and 706 (visible in FIG. 7) is gated by a gate 708, 709 until the FSM receives an output from event counter 480, 481 indicating that the counter 480, 481 has decremented to zero.

In some embodiments, programmable serial port 400 may include a status register 495 and a comparator 490. Status register 495 is capable of receiving data indicative of the status of any other component of programmable serial port 400 (e.g., a bit may indicate that a particular register is full, empty or overflowed, or may indicate a parity bit error). FSMs 420 and 421 may perform conditional operations, for example, based on any of the bits of the status register or an event counter 480, 481 count value. A comparator 490 may be included to facilitate the execution of conditional operations by FSMs 420 and 421. For example, comparator 490 may compare a data value in a selected register.

Figure 4B:
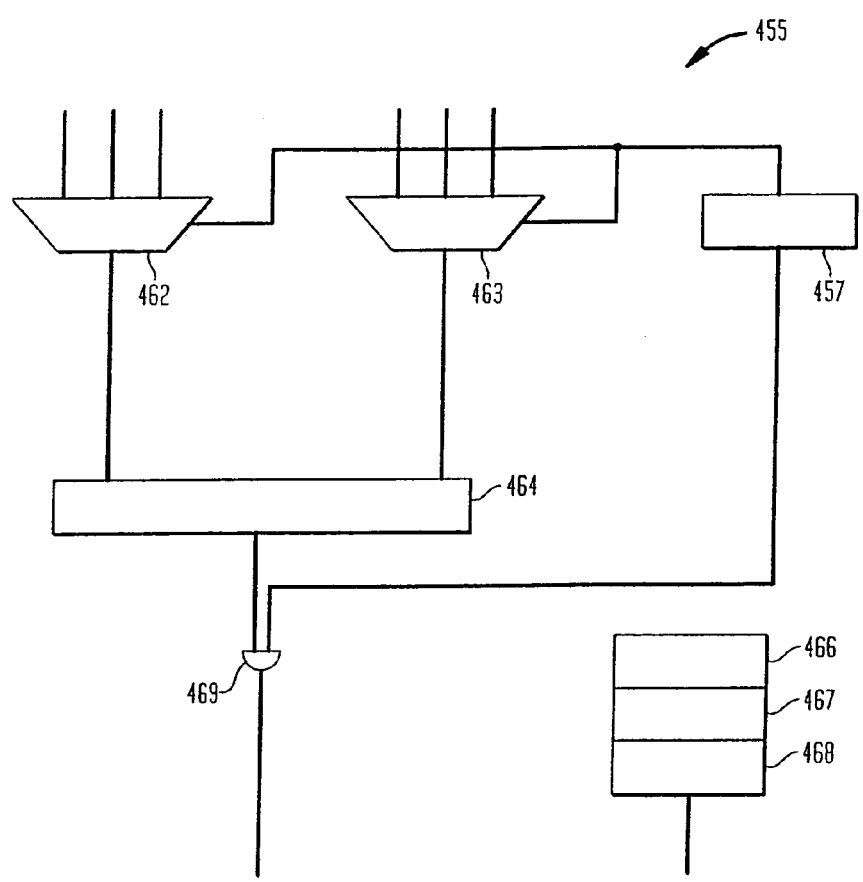
FIG. 4B, a schematic diagram of an exemplary interrupt processing module.

Optionally, interrupt processing may be provided by interrupt processing modules 455 and 456. Referring to FIG. 4B, a schematic diagram of an exemplary interrupt processing module 455 is illustrated. An interrupt processing module is defined configured and arranged to selectively interrupt an FSM according to at least a first operand. Interrupt processing module includes a first interrupt select register 457 to control multiplexers 462 and 463, which provide a first operand and a second operand, respectively, to an operator module 464. For example, first operand and second operand can be selected bits of status register 495, or one of first operand and second operand may be a selected data value. Operator module 464 performs a selected operation on the selected operands and generates an output (e.g., logical AND or logical OR of their values). An interrupt configuration register 466 may be used to control enabling of an interrupt, inversion of an input or an output, and whether the comparison is performed upon receiving a detected level or edge. An interrupt configuration register may contain an interrupt enable bit to control an AND gate 469, to determine whether an interrupt should be provided to an FSM and thereby cause an interrupt of the FSM.

Upon receiving an interrupt, an FSM enters a routine beginning at an address (i.e., an interrupt vector) specified in interrupt address register 467. Optionally, upon receipt of an interrupt, an FSM may store a return address in return register 468 to allow the FSM to return to the program line which the finite state machine was executing when the interrupt occurred.

Figure 5:
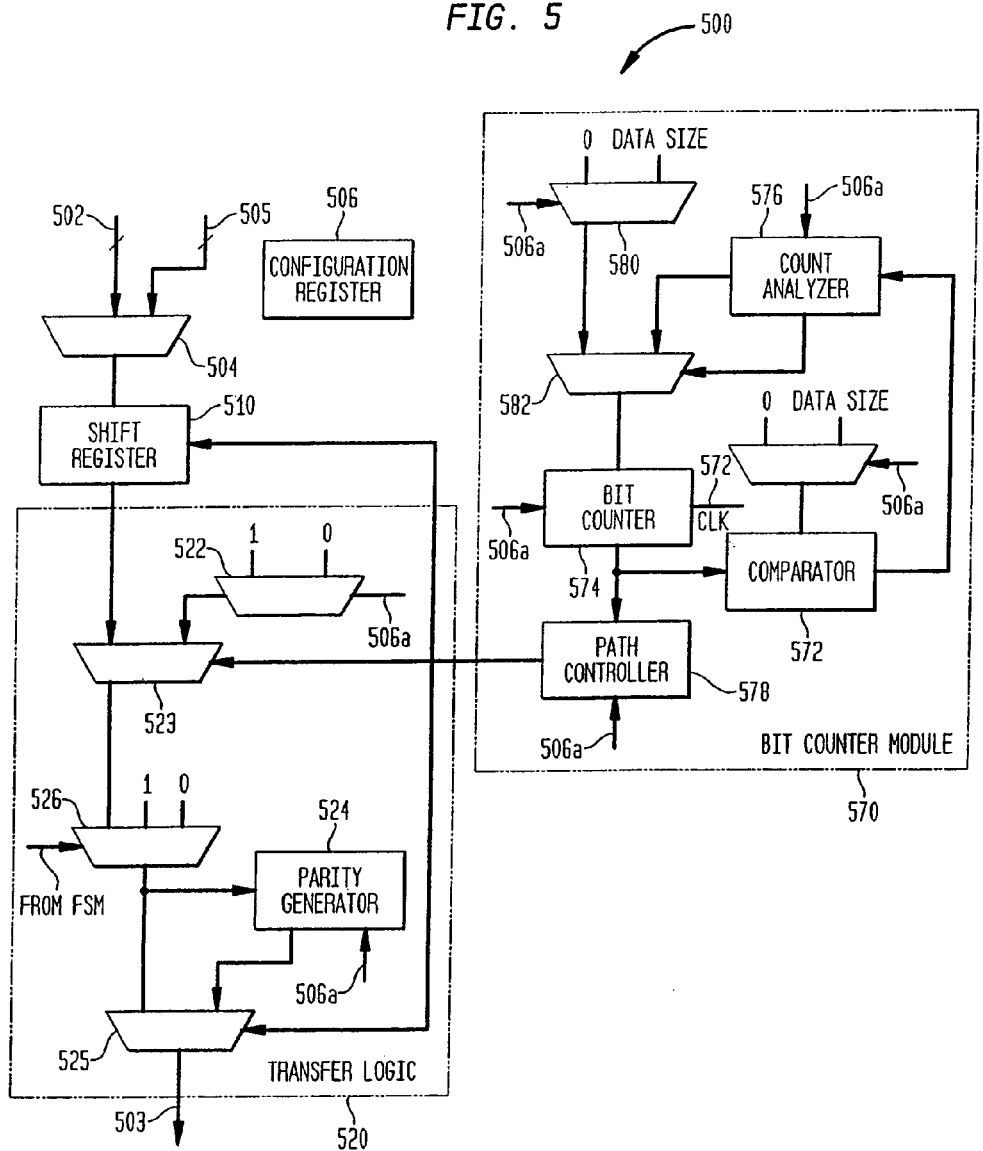
FIG. 5 is a schematic diagram of an exemplary embodiment of a transfer register shift module according to at least some aspects of the present invention.

FIG. 5 is a schematic diagram of an exemplary embodiment of a transfer register shift module 500 according to at least some aspects of the present invention. Shift register module 500 is defined herein to include at least a shift register 510 to serialize data received on channel 502. Optionally, shift register 500 includes a bit counter module 570, transfer logic 520, and a transfer configuration register 506. Bit counter 574 is configured to maintain a numbered count of the bits of serial data output by shift register module 500.

Shift register module 500 receives an input comprising a set of parallel data bits from a buffer (e.g., buffer 420 in FIG. 4A) on channel 502 or from an alternative source such as a memory location designated by FSM 420 (shown in FIG. 4A) on channel 505. The source of the parallel input is determined by a multiplexer 504. Shift register module 500 provides a serial output corresponding to the parallel set of bits on channels 503. For example, the output is provided to driver 380 (visible in FIG. 3A).

Shift register 510 serializes the selected parallel input. It is to be understood that shift register 510 as defined herein includes a conventional shift register or any other structure suitable for serializing data (e.g., a buffer coupled to multiplexer to a selectively output serial bits corresponding to a parallel set of input data bits).

Transfer logic 520 includes a multiplexer 522 to generate a stop bit and a multiplexer 523 to provide the stop bit as output. Additionally, transfer logic 520 includes a parity generator 524 and a multiplexer 525 to provide the parity bit to be output. Multiplexer 522 selects a logic level high or a logic level low as determined by a control signal specified by transfer configuration register 506. A data bit multiplexer 526 allows shift register module 500 to control the source of the data output via channel 503; for example in a given protocol a given bit may be specified to come from the shift register 510, FSM 420, or may be selected to be logic level high or logic level low. Parity bit generator 524 receives data bit values output from data bit multiplexer 526 and calculates a parity bit.

As described above, according to aspects of the present invention, shift register module 500 is decremented automatically in response to receiving a clock pulse 572. A parity bit is automatically output after transmission of data bits is competed (if a protocol requires), and a stop state is automatically entered after receipt of a predetermined number of clock cycles after the bit counter reaches zero, without need for the FSM to execute further instructions. Therefore, the number of instructions executed by the FSM to achieve an output according to a selected protocol is relatively fewer and the overall execution time to achieve an output is relatively short; thus, a programmable serial port is capable of providing outputs and accepting inputs according to a wide variety of protocols.

To achieve the above automatic outputs, bit counter module 570 has a bit counter 574 a comparator 572, a count analyzer 576, a path controller 578, and other logic as described below. Path controller 578 receives a count value and controls shift register 510, and transfer logic 520 to automatically provide output on channel 503 according to a selected protocol. Configuration register 506 contains data provided by controller 450 (shown in FIG. 4 above) to arrange and control each of the above components in accordance with the selected protocol.

An initial count value is provided to bit counter 574 by multiplexer 580, depending on whether an input 506a from configuration register 506 indicates that the selected protocol requires that the most significant bit or the least significant bit be sent first. If the most significant bit is to be sent first, multiplexer 580 provides an initial count value equal to the data size (i.e., the total number of data bits in a given set of data bits provided by channel 502) and bit counter 574 decrements to zero; and if the least significant bit is to be sent first, multiplexer 580 provides an initial count value equal to zero and bit counter 574 increments to a value equal to the data size. For each clock pulse, path controller 578 selects whether a data value, parity bit or stop bit is sent, based on the count from bit counter 574.

Upon receiving a clock pulse 572, bit counter 574 increments or decrements its count, based on the selected protocol. Path controller 578 receives the count value from bit counter 574. Path controller 578 compares the count value to input 506a from configuration register 506 to determine whether multiplexers 523, 526, 525 should be configured to provide a data bit from shift register 510, a parity bit or stop bit on output channel 503. Upon receiving a first zero count value, path controller 578 controls multiplexers 523, 526, 525 to output a least significant data bit, a parity bit or a stop bit. Upon receiving a second zero count, path controller 578 controls multiplexers 523, 526, 525 to provide a stop bit if input 506a indicates that a stop bit is to be sent. Path controller 578 may provide the count value to shift register 510, which may be used as a pointer to the data bit to be output; accordingly, each of the data bits in shift register is output in response to a clock pulse.

Comparator 572 determines if the number of bits sent corresponds to the data size (e.g., if the least significant bit was transmitted first, comparator 572 determines if the counter value is equal to the data size). The output from comparator 572 is provided to count analyzer 576, and the count analyzer 572 uses the input 506a in combination with the output of the comparator to determine the next value of bit counter 574. Until comparator 572 indicates that a number of bits corresponding to the data size has been sent, the bit count is incremented (or decremented), as appropriate. Upon receiving an output from comparator 572 indicating that a number of bits corresponding to the data size has been sent, count analyzer 576 determines whether a parity bit is necessary (e.g., after the counter reaches zero, the counter is allowed to remain at zero for a first pulse), or indicates that a stop bit is necessary (e.g., the counter is allowed to remain at zero for a second pulse after reaching zero), and whether circular mode is set (i.e., the counter is reset to the initial value after the parity bit and stop bit are set).

Figure 6:
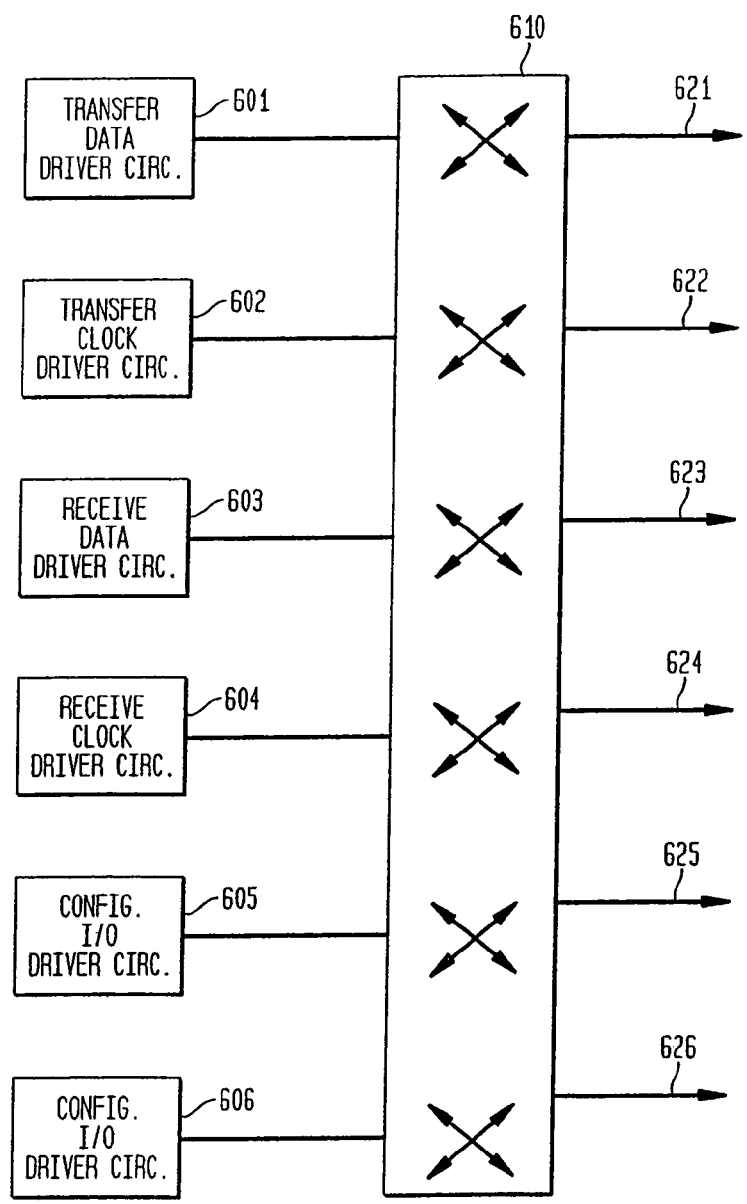
FIG. 6 is a schematic diagram of an example of a driver (e.g., driver in FIG. 3A) as may be used in a programmable port.

FIG. 6 is a schematic diagram of an example of a driver 480 as may be used in the programmable port. In the illustrated exemplary embodiment, six input/output driver circuits are provided: transfer data driver circuit 601, transfer clock driver circuit 602, receive data driver circuit 603, receive clock driver circuit 604, and two configurable input/output circuits 605 and 606. For example, the configurable input/output circuits 605 and 606 may provide enable signals, one each for the receive and transmit ports, or may be used to receive a signal to be used as a slave clocking signal (described below).

The circuits may be any conventional input/output driver circuits. For example, the circuits may allow for selection of a source/receiver (e.g., power supply at logic one or zero, a input/output from an FSM, or an output from a shift register), selection of polarity of an output signal, selection of a high impedance state, detection of a data-in/data-out mismatch and parity bit computation. Optionally, a switch 610 may be included to allow mapping of input/outputs to any of six output pins 621–626 of an integrated circuit in which the programmable data port may be located.

Figure 7:
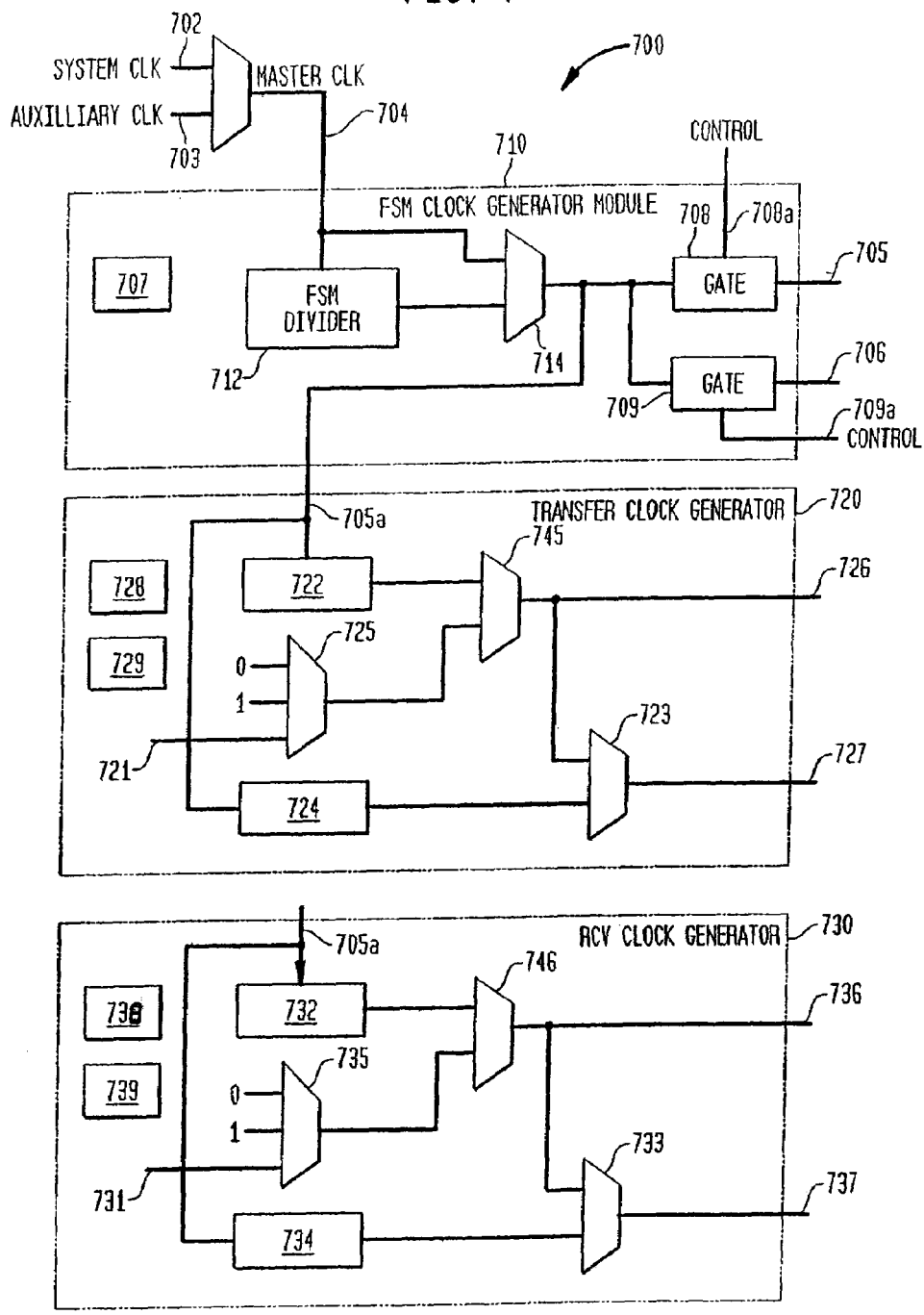
FIG. 7 is a schematic diagram of one example of an embodiment of a clock generator for use with at least some programmable serial ports according to aspects of the present invention.

FIG. 7 is a schematic diagram of one example of an embodiment of a clock generator 700 for use with at least some programmable serial ports according to aspects of the present invention. Clock generator 700 selects a master clock signal from a plurality of clock sources; for example, a master clock signal may be selected from a system clock 702 input from a microcontroller (e.g., microcontroller 450 in FIG. 4) or an auxiliary clock 703 input from any source of pulses suitable for use as a master clock signal 704, and provides output clock signals. Such output clock signals include output clock signals 705 and 706 to a first and a second FSM (e.g., FSMs 420 and 421 in FIG. 4 above), output clock signals 726 and 736 to first and second shift register modules (e.g., shift register modules 412 and 413), and output clock signals 727 and 737 to a driver (e.g., driver 479 in FIG. 4).

An FSM clock generator module 710 receives master clock signal 704 and provides clock signal outputs 705 and 706 to the state machines (e.g., FSMs 420 and 421 in FIG. 4 above) on output channel 705 and 706, respectively, to control instruction execution by the state machines. The output clock signals 705 and 706 may be divided or phase-delayed relative to master clock signal 704 by an FSM divider 712 coupled to output channel 705 and 706, or FSM divider 712 may be bypassed (depending on the control signal applied to multiplexer 714) such that the clock signal outputs 705 and 706 are the same as master clock signals 704. Gates 708 and 709 may be coupled to output channels 707, 708, respectively, to gate output clock signals 705 and 706; for example, gates 708 and 709 may be controlled (i.e., gated) by control signals from FSMs 420, 421, respectively, resulting from the execution of a Wait instruction, a Delay instruction or a Clock instruction invoking power-save mode, discussed below, and indicated generically by the inputs 708a and 709a labeled "control."

FSM clock generator module 710 includes a configuration register 707 to determine the clock source of the master clock 704, the division factor to be applied by divider 712, and the phase of the output clock signals 705 and 706 relative to the clock source. The control inputs 708a and 709a also may be set by the contents of configuration registers in some embodiments.

A transfer clock generator module 720 receives a signal output 705a from FSM clock generator module 710, and alternative clock inputs (for example, an asynchronous slave clock signal 721, a logical high, and a logical low signal) and provides clock signal outputs 726 and 727 (comprising a plurality of clock pulses) to a transfer shift register (412 in FIG. 4) and a driver (e.g., driver 479 in FIG. 4), respectively. Transfer divider 722 and transfer divider 724 divide the ungated output 705a of FSM clock generator module 710, and is coupled to the transfer shift register to provide clock signal output 726. Multiplexer 725 selects among slave clock signal 721, a logic level high and logic level low; and multiplexer 745 selects between the output of multiplexer 725 and the output of transfer divider 722, to provide clock signal output 726. Multiplexer 723 selects between the output of transfer divider 724 and the output of multiplexer 745 to provide clock signal output 727. Accordingly, by appropriate configuration of multiplexer 723, the transfer shift register and transfer driver may be driven by the same clock signal.

Transfer clock configuration register 728 controls the divide factors of dividers 722 and 724, and the start polarity, stop polarity of the outputs, whether the clock is operated in power-save mode (i.e., whether the FSM clock generator is turned off during transfer clock operation), and whether the operation of the FSM clock is started at the end of operation or one clock cycle early (for reasons discussed in greater detail below with reference to FIGS. 8A and 8B). Transfer clock divider register 729 controls the duty cycle of the transfer clock signal. For example, the transfer clock divide register may include a high-level divide ratio and a low-level divide ratio to determine the number of cycle in which clock signals 726 and 727 are in the high level and low level, thus determining the duty cycle. One of ordinary skill in the art would understand the implementation of such high-level and low-level divide ratios; therefore further details are not included herein.

A receive clock generator module 730 receives a signal output 705a from FSM clock generator module 710, and alternative clock inputs (for example, an asynchronous slave clock signal 731, a logical high, and a logical low signal) and provides a clock signal outputs 736 and 737 to a receive shift register (413 in FIG. 4) and a driver (e.g., driver 479 in FIG. 4), respectively. Receive divider 732 and receive divider 734 divide the ungated output 705a of FSM clock generator module 710. Multiplexer 735 selects among slave clock signal 731, and a logic level high and logic level low, and multiplexer 746 selects between the output of multiplexer 735 and the output of transfer divider 732 to provide a clock signal output 736. Multiplexer 733 selects between output of transfer divider 734 and the output of multiplexer 746 to provide clock signal output 737. Accordingly, by appropriate configuration of multiplexer 43.3 733, the transfer shift register and transfer driver may be driven may be driven by the same clock signal.

Receive clock configuration register 738 controls the divide factor of dividers 732 and 734, and the start polarity as well as the stop polarity of the outputs. Receive clock divider register 739 controls the duty cycle of the transfer clock signal. For example, receive clock divider register 739 may include a high-level divide ratio and a low-level divide ratio to determine the number of cycle in which clock signals 736 and 737 are in the high level and low level, thus determining the duty cycle. One of ordinary skill in the art would understand the implementation of such high-level and low-level divide ratios; therefore further details are not included herein.

It is to be understood that using clock generator 700, a programmable serial port having a first FSM and a second FSM (e.g., programmable serial port 400 in FIG. 4) may be operated to achieve full duplex operation. Alternatively, clock generator 700 having a first FSM and a second FSM can be operated in half duplex mode having the transfer clock signal and the receive signal formed, such that transfers and receives occur on alternate clock intervals.

FIGS. 8A and B are timing diagrams for two exemplary clocking options. Each timing diagram illustrates a master clock 802, a shift register control clock 804, or 814 (i.e., a transfer clock signal or receive clock signal), and a corresponding FSM clock signal 806, 816. In addition, an indication 810, or 820 is shown of the clock cycle during which Clock instructions are executed, along with an indication 805, or 815 of the clock cycle during which the execution of the instruction occurs following the clock instruction (also referred to as the "next instruction").

FIG. 8A illustrates an exemplary clock generator output for a clock generator generating one clock pulse in a standard mode. In a standard mode, an FSM clock signal 806 is generated during the time period when the shift register control clock signal 804 is generated. Accordingly, the instruction following the Clock instruction is executed during the master clock cycle 805 immediately following clock cycle 810 during which the Clock instruction is executed.

The exemplary timing diagrams correspond to a clock generator having a configuration register that is configured to achieve an off state 821 of one and a start state 823 of zero. Additionally, a duty cycle of one-quarter is achieved by selecting the low-level and high-level divide factors such that two of eight cycles are high.

Figure 8B:
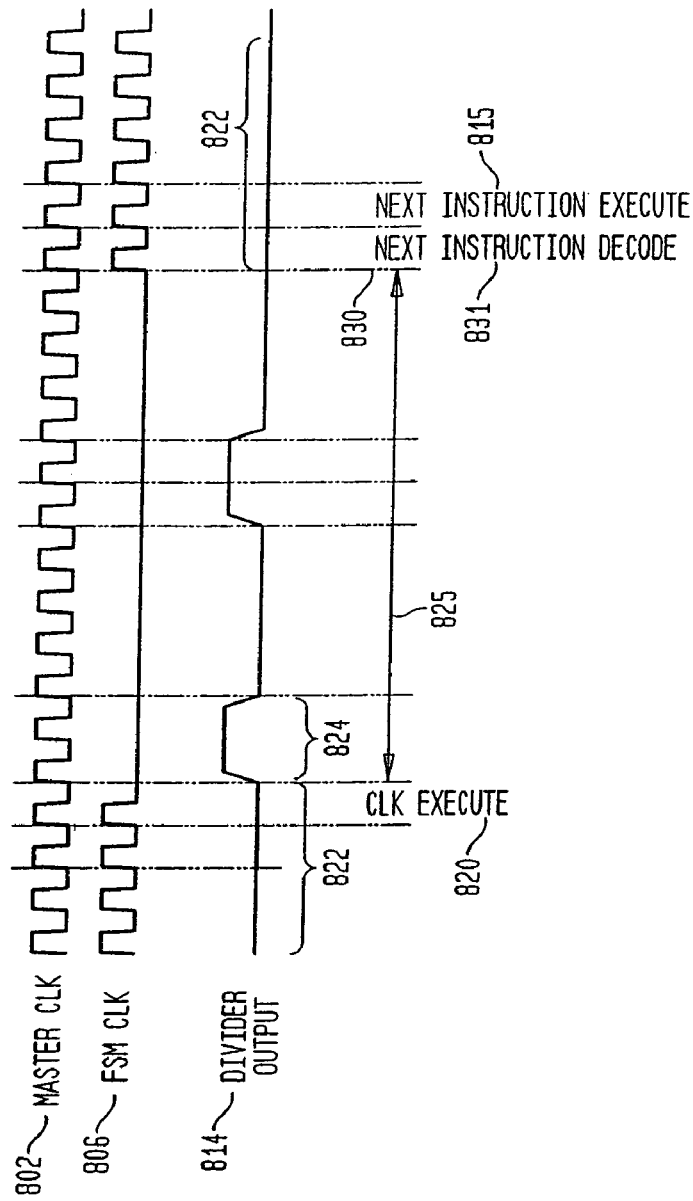
FIG. 8B illustrates a clock generator output for a clock generator operating in a power-save mode.

FIG. 8B illustrates a clock generator output for a clock generator operating in a power-save mode. In a power-save mode, the FSM clock signal 806 is suspended while the shift register control clock signal 814 is generated. Power-save mode allows power consumption to be reduced. For example, power save mode may be used if a selected protocol does not require that instructions be executed while a shift register control clock is generated (i.e., while bits are output from a corresponding shift register).

Power-save mode is achieved by using gates 708, 709 (shown in FIG. 7) to block output of an FSM clock signal while a corresponding shift register module provides an output. During the execution of a Clock instruction, if control registers 728, 738 are configured in power-save mode, gates 708 and/or 709 block signals 705 and 706, respectively, and upon completion of the appropriate number of cycles, gate 708, 709 cease(s) to block the FSM clock signal.

In FIG. 8B, the shift register control signal 816 provides a shift register control clock 814 two periods in duration (as indicated by region 825). The clock signal has a duty cycle of thirty-three percent, an off state 822 of zero and a start state 824 of one.

Because decoding and execution of an instruction requires two clock cycles, execution of the next instruction occurs in the second clock cycle 815 after the end 830 of the shift register control clock signal 814. (The decode of the next instruction occurs during the first clock cycle 831 following end 830) Accordingly, in some embodiments, a gate 708 and/or 709 may be controlled so as to cease blocking the FSM clock signal 816 one cycle before the end 830 of the shift register clock output. This allows the next instruction to be executed in the clock cycle immediately following completion of the shift register clock generation.

Figure 9:
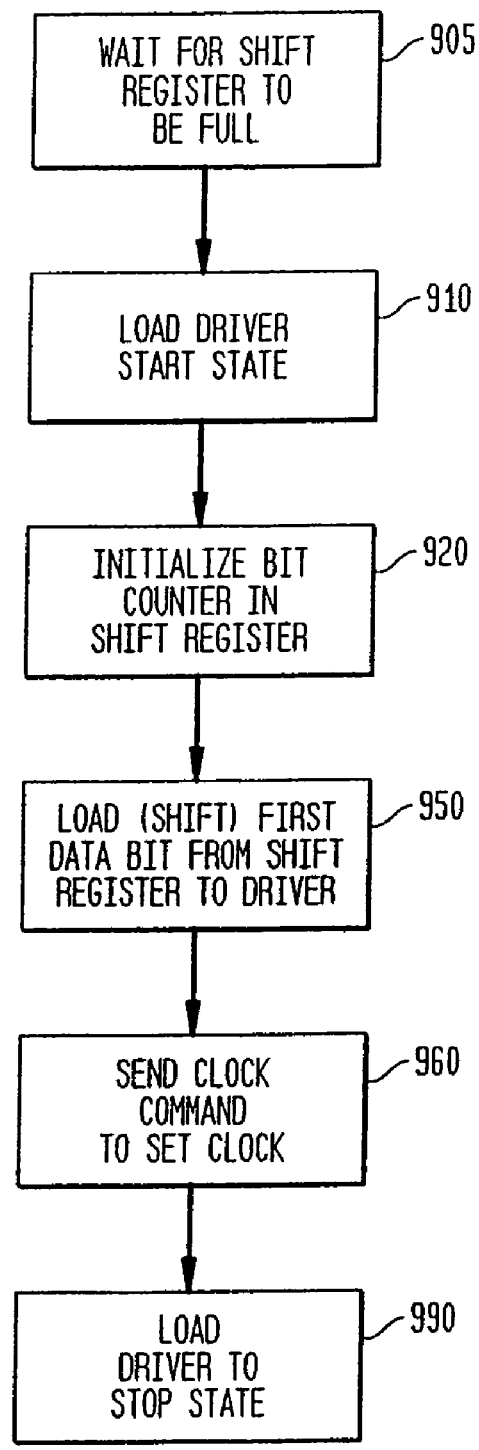
FIG. 9 is a flow chart of an exemplary sequence of instructions for a programmable serial port according to some aspects of the present invention, to achieve a standard output (e.g., a UART compatible output)

FIG. 9 is a flow chart 900 of an exemplary sequence of instructions for a programmable serial port according to some aspects of the present invention, to achieve a standard output (e.g., a UART compatible output). At step 905, the FSM waits for an indication from the shift register that the shift register is full of data. At step 910 the FSM loads the driver with a start state. At step 920, the bit counter is initialized. At step 930, the FSM loads the bit counter in the shift register. The first data bit is sent and the logic value is held for as many clock cycles as necessary for the protocol, at step 950. At step 960, a clock command is sent to the clock generator defining the number of pulses and the division factor for the divider. Finally, the driver is set to a stop state at step 990.

In contrast to the flow chart of the program for a conventional programmable serial port (described above with reference to FIG. 2), it is apparent the execution time necessary to achieve a given data output is significantly reduced according to the method and apparatus shown herein, because a reduced number of instructions need be executed by the FSM to provide a selected output. For example, in FIG. 2 the FSM was required to send a command to the shift register for each bit of data to be output (step 270 in FIG. 2). By contrast, in FIG. 9, a single command is sent to the clock generator (e.g., clock generator 360 in FIG. 3) to generate a predetermined number of pulses, at a rate determined by a divide rate. Because the clock generator is coupled to the shift register, the shift register outputs data bits in response to the clock pulses from the clock generator, thus relieving the FSM of the need to command the shift register to provide each data bit output. Also, in FIG. 2, the FSM decremented the bit counter (step 260) to maintain a numbered count of data bits that were output. By contrast in FIG. 9, the FSM is not required to execute an instruction to decrement a counter because the shift register has a bit counter that is decremented automatically in response to receiving a clock pulse from the clock generator. Additionally, the shift register is arranged to output a parity bit (if the protocol requires) and enter a stop state upon receipt of clock cycles after the bit bits have been sent, without need for the FSM to execute further instructions.

The following list of instructions is an exemplary instruction set to be executed by FSMs 410 and 411 (shown in FIG. 4). FIGS. 10A and 10B are tables illustrating one exemplary set of binary implementations of each of the instructions in the list. The list includes a functional description, as well as an explanation of the bits included in a corresponding binary implementation, for corresponding binary implementations 1000 illustrated in FIGS. 10A and 10B.

Because the binary implementation in FIGS. 10A and 10B is suitable for implementation with the decode and execution architecture in which selected instructions may be executed in parallel (described with reference to FIG. 10A below), some instructions in the following list correspond to two binary implementations, one each in FIG. 10A (for use in bit locations 0–7) and 10B (for use in bit locations 15–8).

Referring to FIGS. 10A and 10B, each instruction is comprised of an operation code 1004 (indicated by logic values one and zero in binary implementations 1000) and one or more data fields and/or address fields.

The following list of instructions includes five types of instructions: configuration instructions, operation control instructions, flow control instructions, timing control instructions, clock control instructions, conditional instructions. Programmable serial bit ports may be implemented using FSMs having any known fetch, decode and execution scheme. For example, the instructions enumerated may be executed sequentially. In some embodiments, the instructions are executed in parallel as described below.

| Configuration Instructions | Brief Description |
|---|---|
| Load | Loads data to a specified register. |

Referring to FIG. 10A (1002), the d values represent the value to be loaded and the i values indicate an address of register to be loaded.

| Dual Bit Load | Loads two selected bits of data to the driver or driver configuration registers. |
|---|---|

Referring to FIGS. 10A and 10B (1004a, 1004b), the i values indicate the bits in which the values are to be loaded, and v values represent the value to be loaded.

| Mask | Allows setting/resetting of selected bits of a selected register. |
|---|---|

Referring to FIG. 10A (1006), the m values form the mask, and the i values represent the address of a register to be masked.

| Map | Used in combination with instructions having a finite number of address bits to increase the number of bits accessible in a given register using the instruction. For example, using the Map instruction, a selected instruction having a three-bit address field may select among greater than 8 bits; the Map instruction selects an eight 8-bit vector from within a register having greater than eight total bits and the three-bit address field selects a bit within the 8-bit vector. For example, Map may be used with the Conditional Execution instruction (discussed below) to select among 55 bits of the status register 495 (shown in FIG. 4A) despite the fact that in some embodiments the Conditional Execution register has only three-bit address field. |
|---|---|

Referring to FIG. 10B (1008), the i values indicate a 8-bit vector.

| Extend | An extend command is used in combination with a another instruction (e.g., a Dual Bit Load or a Trigger) to provide an increased address field. |
|---|---|

Referring to FIG. 10A (1010), the i values represent additional address bits.

| Operation Control Instruction | |
|---|---|
| Trigger | A trigger command enables an FSM to achieve a specified hardwired action by setting selected bits of output from an FSM. The action may be achieved directly or may be achieved indirectly (e.g., via a register hardwired to achieve the specified action). |

Referring to FIGS. 10A and 10B (1012a, 1012b), the i indicates the address of a hardwired register, and bi values indicate a specific bit within the register that corresponds to a particular action.

| Flow Control Instructions | |
|---|---|
| Jump Absolute | Jump to an absolute line of an instruction set |

Referring to FIG. 10A (1014), the a values represent the destination address of the jump.

| Jump Short Relative | A relative jump, limited to a jump of a selected number of lines (e.g., 32 lines forward and 16 lines backward). |
|---|---|

Referring to FIGS. 10A and 10B (1016a, 1016b), the a values represent the number of program lines to be jumped.

| Call Absolute | Jump to an absolute address and store a return address in designated register. |
|---|---|

Referring to FIG. 10A (1018), the a values represent the destination address of the jump.

| Ret | Return to address that was stored in a designated register during a Call Absolute |
|---|---|

Illustrated as 1020a and 1020b in FIGS. 10A and 10B, respectively.

| Software Reset | Resets an FSM. In some embodiments, memory contents may be preserved. |
|---|---|

Illustrated as 1022a and 1022b in FIGS. 10A and 10B, respectively.

| Loop | Performs a loop using a specified start address and a specified end address. The instructions between the start address and the end address are performed a number of times, as specified by a selected register. |
|---|---|

Referring to FIG. 10A (1024), the o1 values indicates a start address and the o2 values indicate an end address for a loop. The number of iterations is fixed by a separate loop counter register.

| Null | A "filler" used to align sixteen-bit instructions in embodiments having a sixteen-bit fetches. Results in no execution. (Aspects of the Null instruction is described in greater detail below with reference to FIG. 10A.) |
|---|---|

Illustrated as 1026 in FIG. 10B.

| Timing Control Instructions | |
|---|---|
| Delay | Delays execution of a next instruction a selected number of clock cycles. As described above, with reference to FIG. 4A, a delay may be executed using event counters 480, 481. |

Delays execution of a next instruction a selected number of clock cycles. As described above, with reference to FIG. 4A, a delay may be executed using event counters 480, 481.

Referring to FIGS. 10A and 10B (1028a, 1028b), the d values represent total delay length.

| Long Delay | Long delay operates the same as Delay except a the duration of the delay is selected using a pointer to a register rather than within the instruction itself. Accordingly, a longer delay period can be specified. |
|---|---|

Referring to FIGS. 10A and 10B (1030a, 1030b), the i values represent a pointer to a register having a total delay length.

| Wait | Waits until a specified condition is true (e.g., a condition specified using status register 495 and comparator 490 (see FIG. 4A). The FSM clock may be gated during execution of a Wait instruction using gates 708, 709. |
|---|---|

Referring to FIG. 10A (1032), the c1 values indicate a first condition to be tested (e.g., an edge detect, a buffer full or empty), and the c2 values represent a second condition. The v1 and v2 values are values to be tested for, for the first condition and second condition, respectively. The mm values select the evaluation to be made for one or both the first condition and the second condition (e.g., an evaluation may include both condition c1 equal v1, and c2 equals v2).

| Clock Control Instructions | |
|---|---|
| Clock | Directs a selected clock divider to output a selected number of clock cycles, in standard or power-save mode depending on the clock configuration register. |

Referring to FIG. 10A (1034), the cd values select a clock selection, and values d represent the number of pulses to be output.

| Logical Instructions | |
|---|---|
| Conditional execution | Execution of a specified instruction is conditioned on a selected condition. |

Referring to FIGS. 10A (1040), the I values represent the bit within a 8-bit vector of the status register that forms the operand, and the v value represent the condition (1=true and 0=false). Typically used as a first byte of a 16-byte instruction; the second byte is the instruction to be executed if the condition is true.

| Compare Data | Compare data in a specified register to specified data value. The comparison may include a comparison based on at least the following operators: less than, greater than, equal to, etc. |
|---|---|

Referring to FIG. 10A (1036), the i values indicate the register operating as the first operand. The d values indicate the data forming the second operand, and the cc values represent the comparison type (data=register, data 2 register, data 9 register).

| Compare Registers | Compare data in a specified register to data in another specified register. |
|---|---|

Referring to FIG. 10A (1038), the i values indicate the register pair forming the first operand, and the second operand, and the cc values represent the comparison type (data=register, data 2 register, data 9 register).

Figure 11A:
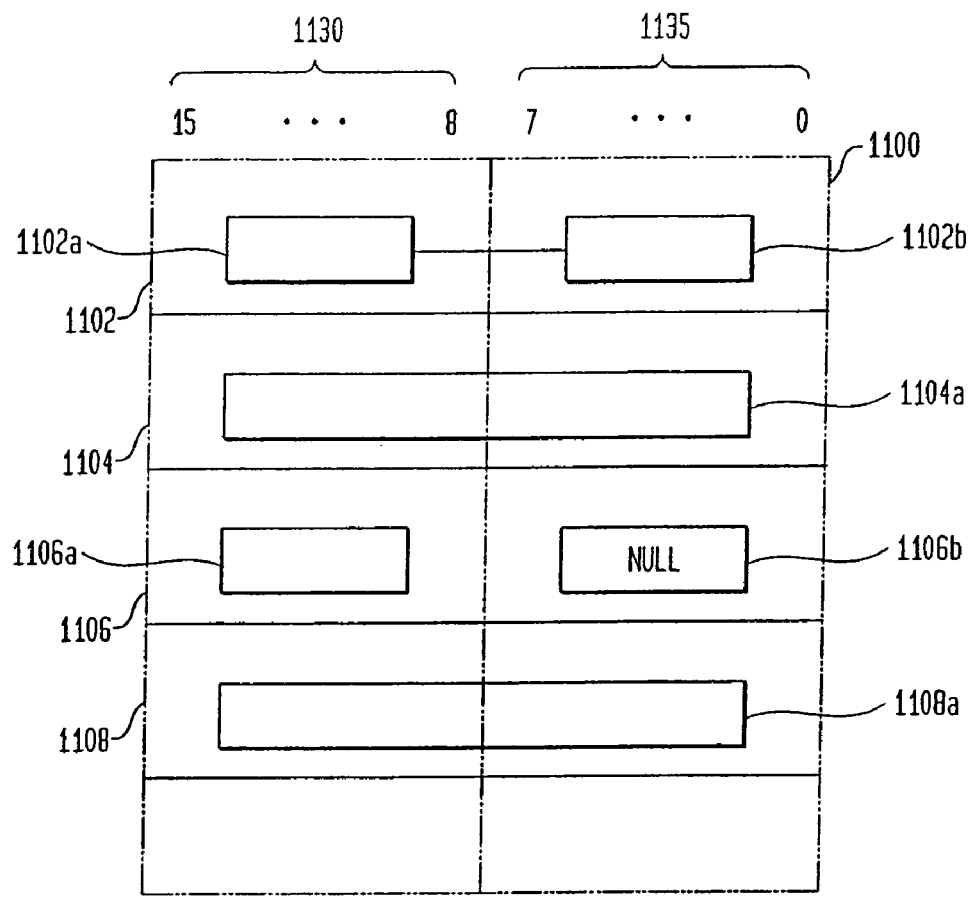
FIGS. 11A and 11B are tables illustrating one exemplary set of binary implementations of an instruction set.

Configuration register contents and instructions for implementing a protocol may be directly generated manually or compiled from a high level input using any suitable tools. An instruction sequence for use with programmable serial ports according to aspects of the present invention may be arranged in any suitable memory organization. FIG. 11A is a schematic illustration of one suitable memory organization 1100 suitable for use with present invention; memory organization 1100 accommodates the use of an instruction set including a combination of eight-bit and sixteen-bit instructions (as discussed above with reference to FIGS. 10A and 10B), and allows a sixteen-bit fetch to occur on each clock cycle without fetching partial instructions during a given fetch. Exemplary memory organization 1100 is comprised of lines of memory 1102, 1104, 1106, 1108; each line of memory is divided into sixteen-bit segments.

In some embodiments, a first eight-bit instruction 1102a is located in the eight-bit memory segments 1120 beginning at location 15 with the most significant bit at location 15, and a second eight-bit instruction 1102b is located in a next eight-bit memory segment 1135 (i.e., beginning at location 7 of line 1102). The second line of memory 1104 is occupied by a sixteen-bit instruction 1104a.

Similar to first line 1102, line 1106 has a first eight-bit instruction 1106a located in eight-bit memory segments 1130 beginning at location 15, with the most significant bit at location 15. However, because the next instruction is a sixteen-bit instruction (1108a), the second instruction 1106b in line 1106 is selected to be a Null instruction (described above), to avoid sixteen-bit fetches that include partial instructions (i.e., half of a sixteen-bit instruction). Accordingly, a compiler for use with such an architecture preferably inserts an eight-bit NULL instruction 1106b in the eight-bit memory segments 1135 of line 1106. Preferably, the Null instruction is a non-executed instructions (i.e., it is simply a placeholder instruction).

Figure 11B:
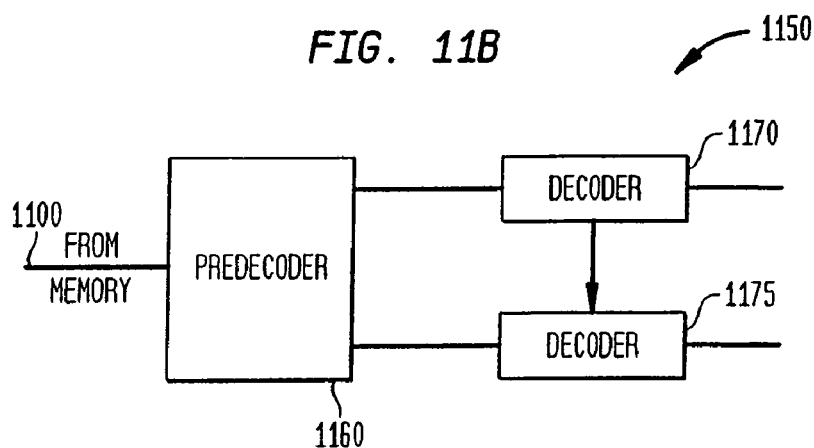

FIG. 11B is a schematic illustration of an exemplary FSM decode and execution architecture 1150 suitable for use with the memory organization 1100 of FIG. 11A. Decode and execution architecture 1150 includes a pre-decoder 1160, and two decoders 1170, 1175.

As mentioned above, two-stage decode and execution architecture 1150 fetches sixteen bits of instruction on each clock cycle as described above. Using known techniques, pre-decoder 1160, examines the operational codes of instruction(s) corresponding to a line of memory 1102, 1104, 1106 (visible in FIG. 11A above). Pre-decoder 1160 determines if the sixteen bits comprise a sixteen-bit instruction, two eight-bit instructions to be executed in parallel, or two eight-bit instructions to be executed serially.

The presence of an instruction illustrated in FIG. 10B located in memory location 1130 (for example, as determined by identifying its operation code) indicates that the eight-bit instructions in locations 1130 and 1135 are to be executed in parallel. The presence of any other instruction indicates the presence of a sixteen-bit instruction or two eight-bit instructions to be executed in parallel.

In the event that a particular line of memory 1102, 1104, 1106 (visible in FIG. 11A) includes a single sixteen-bit instruction, sixteen bits are provided to decoder 1170; in the event that a particular line of memory 1102, 1104, 1106 includes two eight-bit instructions to be executed serially, eight bits corresponding to the first instruction are provided on a first cycle and eight bits are provided on the next cycle such that the first instruction is executed on a first clock cycle and the second instruction is executed on the following clock cycle; and in the event that a particular line of memory 1102, 1104, 1106 includes two eight-bit instructions to executed in parallel, decoder 1170 receives the first instruction and decoder 1175 receives the second instruction on a first clock cycle.

Having thus described the inventive concepts and a number of exemplary embodiments, it will be apparent to those skilled in the art that the invention may be implemented in various ways, and that modifications and improvements will readily occur to such persons. Thus, the examples given are not intended to be limiting. The invention is limited only as required by the following claims and equivalents thereto. Also, it is to be understood that the use of the terms "including," "comprising," or "having" is meant to encompass the items listed thereafter and equivalents thereof as well as additional items before, after, or in-between the items listed.

The invention claimed is:

1. For use in a programmable serial port having a first shift register module and a finite state machine, a clock generator comprising:
   a first output channel to a first shift register module, the first output channel providing to the first shift register a first clock signal comprising a predetermined number of pulses, at a predetermined rate in response to at least one instruction determining said number of pulses and said rate, and
   an input channel to receive at least one instruction, the at least one instruction indicative of the predetermined number of pulses, and the predetermined rate.

2. The clock generator of claim 1, further comprising a second output channel to a second shift register module, the second output channel providing a second clock signal comprising a predetermined number of pulses, at a predetermined rate in response to at least one instruction.

3. The clock generator of claim 1, further comprising a second output channel to a finite state machine, the second output channel providing a second clock signal to the finite state machine.

4. The clock generator of claim 3, further comprising a gate coupled to the second output channel, such that the second clock signal passes through the gate, the gate controllable by the at least one of the instruction indicative of the predetermined number of pulse, and the predetermined rate.

5. The clock generator of claim 4, further comprising a divider coupled to the second output channel to receive the second clock signal, and coupled to the first output channel to provide the first clock signal, whereby the second clock signal is divided to form the first clock signal.

6. A shift register control module, to control a first shift register module including a first shift register having an input channel to receive a parallel input of a first plurality of bits and a serial output channel to provide a serial output of a second plurality of bits, and further having at least one register for controlling the shift register responsive to instructions, comprising:
  a first finite state machine to provide said instructions; and
  a clock generator coupled to the first finite state machine, providing a first clock signal comprising a first plurality of clock pulses to the first shift register in response to at least one instruction from the first finite state machine, the serial output of the second plurality of bits occurring in response to at least one of said instructions provided to the first shift register module and the first clock signal.

7. The shift register control module of claim 6, wherein the first finite state machine is clocked by a second signal provided by the clock generator.

8. The shift register control module of claim 7, wherein the clock generator is coupled to the first finite state machine through a gate controllable by an at least one of the instructions.

9. The shift register control module of claim 8, further comprising a divider coupled to the first finite state machine to receive the second clock signal, and coupled to the first shift register module to provide the first clock signal, wherein the second clock signal is divided to form the first clock signal.

10. The shift register control module of claim 6, wherein the at least one program instruction is from the finite state machine.

11. The shift register control module of claim 6, wherein the finite state machine is configured and arranged to provide instructions corresponding to a plurality of serial communications protocols.

12. A programmable serial port, comprising:
  a first shift register module including a shift register having an input channel to receive a parallel input of a first plurality of bits and a first output channel to provide a serial output of a second plurality of bits, and further having a register for controlling the shift register module responsive to instructions;
  a first finite state machine to provide said instructions, the finite state machine providing said instructions to the shift register module to control operation of the shift register; and
  a clock generator coupled to the finite state machine, providing a first clock signal comprising a first plurality of clock pulses to the first shift register module in response to at least one of said instructions from the finite state machine, the serial output of the second plurality of bits occurring in response to said instructions provided to the shift register module and the first clock signal.

13. The programmable serial port of claim 12, wherein the clock generator comprises an second output channel to the first finite state machine, the channel providing a second clock signal to the first finite state machine, the signal comprising a second plurality of clock pulses.

14. The programmable serial port of claim 13, further comprising a divider coupled to the second output channel to receive the second clock signal, and coupled to the first output channel to provide the first clock signal, wherein the second clock signal is divided to form the first clock signal.

15. The programmable serial port of claim 12, wherein the clock generator is coupled to the first finite state machine through a gate controllable by an at least one of the instructions.

16. The programmable serial port of claim 15, wherein the gate is controllable to block the second clock signal while shift register provides the serial output.

17. The programmable serial port of claim 12, wherein the finite state machine is configured and arranged to provide instructions corresponding to a plurality of serial communications protocols.

18. The programmable serial port of claim 12, wherein each of the second plurality of bits is output in response to a clock pulse of the second plurality of pulses.

19. The programmable serial port of claim 12, wherein the shift register module further comprises a bit counter, the bit counter configured to maintain a numbered count of the serial output of the second plurality of bits.

20. The programmable serial port of claim 19, wherein the bit counter is decremented in response to a clock pulse of the second plurality of pulses.

21. The programmable serial port of claim 20, wherein each of the second plurality of bits is one of a data bit, a parity bit, and a stop bit.

22. The programmable serial port of claim 21, wherein each of the second plurality of bits is selected based on the bit count.

23. The programmable serial port of claim 12, wherein the shift register module further comprises a parity generator.

24. The programmable serial port of claim 23, wherein the shift register module outputs a parity bit from the parity generator in response to a clock pulse of the second plurality of pulses.

25. The programmable serial port of claim 12, further comprising a programmable driver coupled to the first output channel to control the electrical parameters of the serial output.

26. The programmable serial port of claim 12, further comprising an interrupt processing module coupled to the first finite state machine to cause an interrupt of the finite state machine.

27. The programmable serial port of claim 12, further comprising a second shift register module, the clock generator coupled the second shift register module to provide a second clock signal comprising a second plurality of clock pulses, the second shift register module providing a second serial output in response to the second clock signal.

28. A programmable serial port, comprising:
  a shift register module having an input channel to receive a parallel input of a plurality of bits and an output channel to provide a serial output of the plurality of bits, the shift register module including a shift register to provide the serial output and a bit counter, the bit counter configured to maintain a numbered count of the serial output of the plurality of bits, the serial output and the bit counter responsive to instructions;
  a finite state machine coupled to the shift register module to provide said instructions to the shift register module; and
  wherein the bit counter is decremented in response to a clock pulse.

29. The programmable serial port of claim 28, wherein each of the plurality of bits corresponding to the serial output is one of a data bit, a parity bit, and a stop bit.

30. A programmable serial port, comprising:
  a shift register module having an input channel to receive a parallel input of a plurality of bits and an output channel to provide a serial output of the plurality of bits, the shift register module including a shift register to provide the serial output and a bit counter, the bit counter configured to maintain a numbered count of the serial output of the plurality of bits, the serial output and the bit counter responsive to instructions;

a finite state machine coupled to the shift register module to provide said instructions to the shift register module; and wherein the shift register module further comprises a parity generator which provides a parity bit in response to the numbered count.

31. The programmable serial port of claim 30, wherein each of the plurality of bits corresponding to the serial output is selected based on the numbered count.

32. A method of controlling a shift register module comprising a first shift register containing a first plurality of bits, to provide a serial output according to a selected one of a plurality of serial communications protocols, the first shift register module coupled to a clock generator and a finite state machine, said method comprising:

according to the selected protocol, selecting an instruction sequence to be executed by the finite state machine from among a plurality of instruction sequences, each of the instruction sequences corresponding to a protocol;

controlling the clock generator according to an instruction of the selected instruction sequence to provide a first plurality of clock pulses to the shift register module, without further control by the finite state machine; and outputting a second plurality of bits corresponding to first plurality of bits in response to the clock pulses and execution of the instruction sequence.

33. The method of controlling a shift register module of claim 32, further comprising an act of maintaining a count of the second plurality of bits.

34. The method of controlling a shift register module of claim 33, further comprising an act of selectively outputting a parity bit in response to the count.

35. The method of controlling a shift register module of claim 32, further comprising the act of controlling the clock generator to provide a third plurality of clock pulses to a second shift register module containing a third plurality of bits, and outputting a fourth plurality of bits corresponding to third plurality of bits, in response to the clock pulses.

36. The method of controlling a shift register of claim 32, further comprising an act of controlling the clock generator to provide a second plurality of clock pulses to control execution of the instruction sequence by the state machine.

37. The method of controlling a shift register of claim 36, further comprising an act of blocking the second plurality of clock pulses, wherein the executing of the plurality of instruction is caused to cease, while outputting the second plurality of bits.

38. The method of controlling a shift register of claim 34, wherein the controlling the clock generator according to an instruction includes specifying the number of pulses and the clock rate.

39. For use in a programmable serial port having a first shift register module and a finite state machine, a clock generator comprising:

a first output channel to a first shift register module, the first output channel providing to the first shift-register a first clock signal comprising a predetermined number of pulses, at a predetermined rate in response to an instruction determining said number of pulses and said rate, and an input channel to receive at least one instruction, the at least one instruction indicative of the predetermined number of pulses, and the predetermined rate.

40. The clock generator of claim 39, further comprising a second output channel to a second shift register module, the second output channel providing a second clock signal comprising a predetermined number of pulses, at a predetermined rate in response to at least one instruction.

41. The clock generator of claim 39, further comprising a second output channel to a finite state machine, the second output channel providing a second clock signal to the finite state machine.

42. The clock generator of claim 41, further comprising a gate coupled to the second output channel, such that the second clock signal passes through the gate, the gate controllable by the at least one of the instruction indicative of the predetermined number of the predetermined number of pulse, and the predetermined rate.

43. The clock generator of claim 42, further comprising a divider coupled to the second output channel to receive the second clock signal, and coupled to the first output channel to provide the first clock signal, whereby the second clock signal is divided to form the first clock signal.

44. A shift register control module, to control a first shift register module including a first shift register having an input channel to receive a parallel input of a first plurality of bits and a serial output channel to provide a serial output of a second plurality of bits, and further having at least one register for controlling the shift register responsive to instructions, comprising:

a first finite state machine to provide said instructions; and a clock generator coupled to the first finite state machine, providing a first clock signal comprising a first plurality of clock pulses to the first shift register in response to an instruction from the first finite state machine, the serial output of the second plurality of bits occurring in response to at least one of said instructions provided to the first shift register module and the first clock signal.

45. The shift register control module of claim 44, wherein the first finite state machine is clocked by a second signal provided by the clock generator.

46. The shift register control module of claim 45, wherein the clock generator is coupled to the first finite state machine through a gate controllable by an at least one of the instructions.

47. The shift register control module of claim 46, further comprising a divider coupled to the first finite state machine to receive the second clock signal, and coupled to the first shift register module to provide the first clock signal, wherein the second clock signal is divided to form the first clock signal.

48. The shift register control module of claim 44, wherein the at least one program instruction is from the finite state machine.

49. The shift register control module of claim 44, wherein the finite state machine is configured and arranged to provide instructions corresponding to a plurality of serial communications protocols.

50. A programmable serial port, comprising:

a first shift register module including a shift register having an input channel to receive a parallel input of a first plurality of bits and a first output channel to provide a serial output of a second plurality of bits, and further having a register for controlling the shift register module responsive to instructions;

a first finite state machine to provide said instructions, the finite state machine providing said instructions to the shift register module to control operation of the shift register; and a clock generator coupled to the finite state machine, providing a first clock signal comprising a first plurality of clock pulses to the first shift register module in response to a said instruction from the finite state machine, the serial output of the second plurality of bits occurring in response to said instruction provided to the shift register module and the first clock signal.

51. The programmable serial port of claim 50, wherein the clock generator comprises an second output channel to the first finite state machine, the channel providing a second clock signal to the first finite state machine, the signal comprising a second plurality of clock pulses.

52. The programmable serial port of claim 51, further comprising a divider coupled to the second output channel to receive the second clock signal, and coupled to the first output channel to provide the first clock signal, wherein the second clock signal is divided to form the first clock signal.

53. The programmable serial port of claim 50, wherein the clock generator is coupled to the first finite state machine through a gate controllable by an at least one of the instructions.

54. The programmable serial port of claim 53, wherein the gate is controllable to block the second clock signal while shift register provides the serial output.

55. The programmable serial port of claim 50, wherein the finite state machine is configured and arranged to provide instructions corresponding to a plurality of serial communications protocols.

56. The programmable serial port of claim 50, wherein each of the second plurality of bits is output in response to a clock pulse of the second plurality of pulses.

57. The programmable serial port of claim 50, wherein the shift register module further comprises a bit counter, the bit counter configured to maintain a numbered count of the serial output of the second plurality of bits.

58. The programmable serial port of claim 57, wherein the bit counter is decremented in response to a clock pulse of the second plurality of pulses.

59. The programmable serial port of claim 58, wherein each of the second plurality of bits is one of a data bit, a parity bit, and a stop bit.

60. The programmable serial port of claim 59, wherein each of the second plurality of bits is selected based on the bit count.

61. The programmable serial port of claim 60, wherein the shift register module further comprises a parity generator.

62. The programmable serial port of claim 61, wherein the shift register module outputs a parity bit from the parity generator in response to a clock pulse of the second plurality of pulses.

63. The programmable serial port of claim 50, further comprising a programmable driver coupled to the first output channel to control the electrical parameters of the serial output.

64. The programmable serial port of claim 50, further comprising an interrupt processing module coupled to the first finite state machine to cause an interrupt of the finite state machine.

65. The programmable serial port of claim 50, further comprising a second shift register module, the clock generator coupled the second shift register module to provide a second clock signal comprising a second plurality of clock pulses, the second shift register module providing a second serial output in response to the second clock signal.

* * * * *